US009595580B2

(12) United States Patent
Shin et al.

(10) Patent No.: US 9,595,580 B2
(45) Date of Patent: Mar. 14, 2017

(54) TWO-DIMENSIONAL (2D) MATERIAL ELEMENT WITH IN-PLANE METAL CHALCOGENIDE-BASED HETEROJUNCTIONS AND DEVICES INCLUDING SAID ELEMENT

(71) Applicant: Samsung Electronics Co., Ltd., Suwon-Si, Gyeonggi-Do (KR)

(72) Inventors: Hyeonjin Shin, Suwon-si (KR); Seongjun Park, Seoul (KR); Jaeho Lee, Seoul (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 14/508,378

(22) Filed: Oct. 7, 2014

(65) Prior Publication Data
US 2015/0122315 A1    May 7, 2015

(30) Foreign Application Priority Data

Nov. 5, 2013    (KR) .................. 10-2013-0133830

(51) Int. Cl.
*H01L 29/06* (2006.01)
*H01L 31/032* (2006.01)
(Continued)

(52) U.S. Cl.
CPC .......... *H01L 29/0665* (2013.01); *C01B 19/04* (2013.01); *C01G 25/00* (2013.01);
(Continued)

(58) Field of Classification Search
CPC ..... H01L 29/06; H01L 29/0665; H01L 29/10; H01L 29/22; H01L 29/221; H01L 29/24;
(Continued)

(56) References Cited

U.S. PATENT DOCUMENTS 4,822,590 A     4/1989  Morrison et al.
5,021,672 A *   6/1991  Parkinson .............. B82Y 10/00
                                                       250/423 F
(Continued)

FOREIGN PATENT DOCUMENTS

KR    2011-0061909 A    6/2011
KR    101335683 B1      12/2013
(Continued)

OTHER PUBLICATIONS

Huang et al., "Lateral heterojunctions within monolayer MoSe2—WSe2 semiconductors", Nature Materials Letters, vol. 13, 1096-1101, Dec. 2014.(published online on Aug. 24, 2014).*
(Continued)

*Primary Examiner* — Marc Armand
*Assistant Examiner* — Younes Boulghassoul
(74) *Attorney, Agent, or Firm* — Harness, Dickey & Pierce, P.L.C.

(57) ABSTRACT

According to example embodiments, a two-dimensional (2D) material element may include a first 2D material and a second 2D material chemically bonded to each other. The first 2D material may include a first metal chalcogenide-based material. The second 2D material may include a second metal chalcogenide-based material. The second 2D material may be bonded to a side of the first 2D material. The 2D material element may have a PN junction structure. The 2D material element may include a plurality of 2D materials with different band gaps.

44 Claims, 15 Drawing Sheets

(51) Int. Cl.
| | |
|---|---|
| H01L 29/73 | (2006.01) |
| H01L 29/778 | (2006.01) |
| H01L 29/10 | (2006.01) |
| H01L 29/22 | (2006.01) |
| H01L 29/221 | (2006.01) |
| C01B 19/04 | (2006.01) |
| C01G 25/00 | (2006.01) |
| C01G 27/00 | (2006.01) |
| C01G 39/06 | (2006.01) |
| C01G 41/00 | (2006.01) |
| H01L 29/24 | (2006.01) |
| H01L 29/66 | (2006.01) |
| H01L 29/74 | (2006.01) |
| H01L 29/78 | (2006.01) |
| H01L 29/792 | (2006.01) |
| H01L 31/109 | (2006.01) |
| H01L 29/861 | (2006.01) |
| H01L 29/737 | (2006.01) |
| H01L 31/0352 | (2006.01) |

(52) U.S. Cl.
CPC .............. *C01G 27/00* (2013.01); *C01G 39/06* (2013.01); *C01G 41/00* (2013.01); *H01L 29/1033* (2013.01); *H01L 29/22* (2013.01); *H01L 29/221* (2013.01); *H01L 29/24* (2013.01); *H01L 29/66977* (2013.01); *H01L 29/73* (2013.01); *H01L 29/7317* (2013.01); *H01L 29/74* (2013.01); *H01L 29/778* (2013.01); *H01L 29/78* (2013.01); *H01L 29/792* (2013.01); *H01L 29/8611* (2013.01); *H01L 31/032* (2013.01); *H01L 31/109* (2013.01); *C01P 2004/20* (2013.01); *C01P 2006/40* (2013.01); *H01L 29/0673* (2013.01); *H01L 29/737* (2013.01); *H01L 29/861* (2013.01); *H01L 31/0322* (2013.01); *H01L 31/0324* (2013.01); *H01L 31/035281* (2013.01); *Y10T 428/24802* (2015.01)

(58) Field of Classification Search
CPC ... H01L 29/66; H01L 29/66977; H01L 29/73; H01L 29/74; H01L 29/737; H01L 29/778; H01L 29/78; H01L 29/786; H01L 29/792; H01L 29/861; H01L 29/8611; H01L 31/032; H01L 31/035; H01L 31/0352; H01L 31/109; H01L 31/281; C01B 19/04; C01G 41/00; C01G 39/06; C01G 25/00; C01G 27/00
USPC ........................................................ 136/255
See application file for complete search history.

(56) References Cited

U.S. PATENT DOCUMENTS

| | | |
|---|---|---|
| 7,307,277 B2 | 12/2007 | Frey et al. |
| 2011/0127471 A1 | 6/2011 | Shin et al. |

FOREIGN PATENT DOCUMENTS

| | | | | |
|---|---|---|---|---|
| WO | WO-2005/031845 A1 | 4/2005 | | |
| WO | WO 2012/093360 | * 12/2012 | ........... | H01L 29/786 |
| WO | WO-2013/051758 A1 | 4/2013 | | |
| WO | WO-2013/063399 A1 | 5/2013 | | |

OTHER PUBLICATIONS

Gong et al., "Vertical and in-plane heterostructures from WS2/MoS2 monolayers", Nature Materials Articles, vol. 13, 1135-1142, Dec. 2014. (published online on Sep. 28, 2014).*

Duan et al., "Lateral epitaxial growth of two-dimensional layered semiconductor heterojunctions", Nature Nanotechnology, vol. 9, 1024-1030, Dec. 2014. (published online on Sep. 28, 2014).*

Chhowalla et al., "The Chemistry of Two-Dimensional Layered Transition Metal Dichalcogenide Nanosheet," *Nature Chemistry*, 1589, Mar. 20, 2013, pp. 263-275.

Butler et al., "Progress, Challenges, and Opportunities in Two-Dimensional Materials Beyond Graphene," *ACS Nano*, vol. 7, No. 4, 2013, pp. 2898-2926.

Huang et al., "Lateral Heterojunctions Within Monolayer $MoSe_2$—$WSe_2$ Semiconductors," *Nature Materials*, vol. 13, No. 12, Aug. 24, 2014, pp. 1096-1101.

European Search Report for Application No. 14191648.6 (Mar. 18, 2015).

T. Georgiou et al, "Vertical field-effect transistor based on graphene-$WS_2$ heterostructures for flexible and transparent electronics" Nature Nanotechnology, vol. 8, Feb. 2013, p. 100-103.

C. Zeng et al. "Vertical Graphene-Base Hot-Electron Transistor" ACS Publications, Nano Letter, 2013, 13, 2370-2375.

S. Kim et al. "Synthesis of Patch or Stacked Graphene and hBN Flakes: A Route to Hybrid Structure Discovery" ACS Publications, Nano Letter, 2013, 13, 933-941.

L. Song et al. "Large Scale Growth and Characterization of Atomic Hexagonal Boron Nitride Layers" American Chemical Society, Nano Letter, 2010, 10, 3209-3215.

L. Britnell et al. "Resonant tunneling and negative differential conductance in graphene transistors" Nature Communications, 2013, p. 1-5.

K. Liu et al. "Growth of Large-Area and Highly Crystalline $MoS_2$ Thin Layers on Insulating Substrates" ACS Publications, Nano Letter, 2012, 12, 1538-1544.

M. Levendorf et al. "Graphene and boron nitride lateral heterostructures for atomically thin circuitry" Nature, Aug. 30, 2012, vol. 488, 627-632.

H. Terrones et al. "Novel hetero-layered materials with tunable direct band gaps by sandwiching different metal disulfides and diselenides" Scientific Reports, pp. 1-7.

W. Yu et al. "Vertically stacked multi-heterostructures of layered materials for logic transistors and complementary inverters" Nature Materials, vol. 12, Mar. 2013, pp. 246-252.

R. Coehoorn et al. "Electronic structure of $MoSe_2$, $MoS_2$, and $WSe_2$. II. The nature of the optical band gaps" The American Physical Society, vol. 35, No. 12, Apr. 1987.

Z. Liu et al. "Direct Growth of Graphene/Hexagonal Boron Nitride Stacked Layers" ACS Publications, Nano Letter, 2011, 11, pp. 2032-2037.

K. Lee et al. "Large-Scale Synthesis of High-Quality Hexagonal Boron Nitride Nanosheets for Large-Area Graphene Electronics" ACS Publications, Nano Letter, 2012, 12, pp. 714-718.

L. Britnell et al. "Strong Light-Matter Interactions in Heterostructures of Atomically Thin Films" Science, vol. 340, Jun. 14, 2013.

Z. Liu et al. "In-plane heterostructures of gragphene and hexagonal boron nitride with controlled domain sizes" Nature Nanotechnology, pp. 1-6.

L. Britnell et al. "Field-Effect Tunneling Transistor BAsed on Vertical Graphene Heterostructures" Science, 335, Feb. 2012, pp. 947-950.

K. Kim et al. "Large-scale pattern growth of graphene films for stretchable transparent electrodes" Nature, vol. 457, Feb. 2009, pp. 706-710.

Y. Li et al. "$MoS_2$ Nanoparticles grown on Graphene: An Advanced Catalyst for Hydrogen Evolution Reaction" Department of Chemistry, Stanford University.

X. Li et al. "Large-Area Synthesis of High-Quality and Uniform Graphene Films on Copper Foils" Science, vol. 324, Jun. 2009, pp. 1312-1314.

Y. Shi et al. "van der Weals Epitaxy of $MoS_2$ Layers Using Graphene as Growth Templates" ACS Publications, Nano letters, 2012, 12, pp. 2784-2791.

(56) References Cited

OTHER PUBLICATIONS

Y. Shi et al. "Synthesis of Few-Layer hexagonal Boron Nitride Thin Film by Chemical Vapor Deposition" American Chemical Society, Nano Letter, 2010, 10, pp. 4134-4139.
Y. Lee et al. "Synthesis of Large-Area $MoS_2$ Atomic Layers with Chemical Vaper Deposition" pp. 1-9.

* cited by examiner

TWO-DIMENSIONAL (2D) MATERIAL ELEMENT WITH IN-PLANE METAL CHALCOGENIDE-BASED HETEROJUNCTIONS AND DEVICES INCLUDING SAID ELEMENT

RELATED APPLICATIONS

This application claims priority under 35 U.S.C. §119 to Korean Patent Application No. 10-2013-133830, filed on Nov. 5, 2013, in the Korean Intellectual Property Office, the disclosure of which is incorporated herein in its entirety by reference.

BACKGROUND

1. Field

The present disclosure relates to two-dimensional materials, methods of forming the same, and/or devices including two-dimensional materials.

2. Description of Related Art

A two-dimensional (2D) material is a single-layer or half-layer solid material in which atoms form a crystal structure. The most well-known example of a 2D material is graphene. Graphene may be a single-layer (e.g., single atomic layer) structure in which carbon atoms form a hexagonal structure. Graphene may have a band structure that is symmetrical around the Dirac point, and the effective mass of a charge at the Dirac point is very small. Therefore, graphene may have a charge mobility that is at least 10 times or higher (may be even 1000 times or higher) than silicon (Si). Furthermore, graphene may have a very high Fermi velocity ($V_F$). Therefore, the graphene has drawn attention as a next-generation material.

Other than research on graphene, various 2D materials having insulation properties or semiconductor properties are being researched and developed. Research on a 2D material generally includes determination of basic material properties of the 2D material in a flake state (shape) and development of a method of growing the 2D material for large-scale growth. Recently, research on 2D material has expanded to stacking of different 2D materials. However, for actual application of a 2D material to a device, it is desirable to resolve various issues, such as an interface issue between 2D materials or between a 2D material and another material and a transfer issue of a 2D material.

SUMMARY

Example embodiments relate to two-dimensional (2D) material elements having excellent electric/physical properties.

Example embodiments relate to 2D material elements in which different 2D materials are chemically bonded to each other.

Example embodiments relate to 2D material elements capable of resolving an interface issue.

Example embodiments relate to 2D material elements having PN junction structures.

Example embodiments relate to 2D material elements for easy band gap control.

Example embodiments relate to 2D material elements including regions with different band gaps.

Example embodiments relate to methods for forming the 2D materials.

Example embodiments relate to devices (semiconductor devices) to which the 2D materials are applied.

Additional aspects will be set forth in part in the description which follows and, in part, will be apparent from the description, or may be learned by practice of example embodiments.

According to example embodiments, a two-dimensional (2D) material element includes a first 2D material including a first metal chalcogenide-based material; and a second 2D material bonded to a side of the first 2D material. The second 2D material includes a second metal chalcogenide-based material. The first 2D material and the second 2D material are chemically bonded to each other.

In example embodiments, the first 2D material and the second 2D material may be covalently bonded to each other.

In example embodiments, the first 2D material and the second 2D material may be interatomically bonded to each other, and the first 2D material and the second 2D material may have a continuous crystal structure at a bonding portion between the first 2D material and the second 2D material.

In example embodiments, the first metal chalcogenide-based material may be a first transition metal dichalcogenide (TMDC) material, the second metal chalcogenide-based material may be a second transition metal dichalcogenide (TMDC) material, and the first and second metal dichalcogenide (TMDC) materials may be different from each other.

In example embodiments, at least one of the first metal chalcogenide-based material and the second metal chalcogenide-based material may include a metal atom including one of Mo, W, Nb, V, Ta, Ti, Zr, Hf, Tc, Re, Cu, Ga, In, Sn, Ge, and Pb, and a chalcogen atom including one of S, Se, and Te.

In example embodiments, the first 2D material and the second 2D material may be semiconductors.

In example embodiments, the first 2D material may be an n-type semiconductor, and the second 2D material may be a p-type semiconductor. In this case, the first metal chalcogenide-based material may include a first metal atom, the second metal chalcogenide-based material may include a second metal atom, and the first and second metal atoms may be different from each other. The first metal chalcogenide-based material may include a first chalcogen atom, the second metal chalcogenide-based material may include a second chalcogen atom, and the first and second chalcogen atoms may be the same.

In example embodiments, the first metal chalcogenide-based material may be one of $MoS_2$, $MoSe_2$, $MoTe_2$, $WSe_2$, and $WTe_2$.

In example embodiments, the second metal chalcogenide-based material may be one of $WS_2$, $ZrS_2$, $ZrSe_2$, $HfS_2$, $HfSe_2$, and $NbSe_2$.

In example embodiments, the first metal chalcogenide-based material may include $MoS_2$, and the second metal chalcogenide-based material may include $WS_2$.

In example embodiments, a band gap of the first 2D material may be different than a band gap of the second 2D material. In this case, the first metal chalcogenide-based material may include a first chalcogen atom, the second metal chalcogenide-based material may include a second chalcogen atom, and the first and second chalcogen atoms may be different from each other. The first metal chalcogenide-based material may include a first metal atom, the second metal chalcogenide-based material may include a second metal atom, and the first and second metal atoms may be the same.

In example embodiments, the first metal chalcogenide-based material may include one of $MoS_2$, $MoSe_2$, and $MoTe_2$, and the second metal chalcogenide-based material may include another one of $MoS_2$, $MoSe_2$, and $MoTe_2$.

In example embodiments, the first metal chalcogenide-based material may include one of $WS_2$, $WSe_2$, and $WTe_2$, and the second metal chalcogenide-based material may include another one of $WS_2$, $WSe_2$, and $WTe_2$.

In example embodiments, one of the first and second 2D materials may be arranged at two opposite sides of the other one of the first and second 2D materials.

In example embodiments, the first 2D material may be one of a plurality of first 2D materials, the second 2D material may be one a plurality of second 2D materials, and the plurality of first and second 2D materials may define a patterned structure.

In example embodiments, the 2D material element may further include a third 2D material bonded to a side of one of the first 2D material and the second 2D material.

In example embodiments, a semiconductor device may include a multi-layer structure including a semiconductor layer and at least one non-semiconductor layer. The semiconductor layer may include one of the above-described 2D material elements. The at least one non-semiconductor layer may be on or under at least one surface of the semiconductor layer.

In example embodiments, the multi-layer structure may include a first conductive layer and a second conductive layer. The semiconductor layer may be on the first conductive layer. The second conductive layer may be on the semiconductor layer. In this case, the multi-layer structure further may include a third conductive layer and an insulation layer. The third conductive layer may be on the second conductive layer, and the insulation layer may be between the second conductive layer and the third conductive layer.

In example embodiments, the multi-layer structure may include a first insulation layer, a second insulation layer, a first conductive layer, and a second conductive layer. The semiconductor layer may be on the first insulation layer. The second insulation layer may be on the semiconductor layer. The first insulation layer may be on the first conductive layer. The first conductive layer may be facing the semiconductor layer. The second conductive layer may be on the second insulation layer. The second conductive layer may be facing the semiconductor layer.

In example embodiments, the multi-layer structure may include a first conductive layer, a second conductive layer, and an insulation layer. The second conductive layer may be on the first conductive layer. The insulation layer may be between first conductive layer and the second conductive layer.

In example embodiments, the multi-layer structure may include: a first conductive layer spaced apart from the semiconductor layer; an insulation layer between the semiconductor layer and the first conductive layer; and a second conductive layer and a third conductive layer that contact first and second regions of the semiconductor layer, respectively.

In example embodiments, the multi-layer structure may include an insulation layer and a first conductive layer. The semiconductor layer may be on the insulation layer. The first conductive layer may be on the semiconductor layer. In this case, the multi-layer structure may include a second semiconductor layer facing the semiconductor layer. The insulation layer may be between the semiconductor layer and the second semiconductor layer. The multi-layer structure may further include a second conductive layer and a third conductive layer that contact first and second regions of the second semiconductor layer, respectively.

In example embodiments, the at least one non-semiconductor layer may include at least one of a conductive 2D material and an insulating 2D material.

In example embodiments, the semiconductor layer may include at least one of a PN junction structure, a PNP junction structure, and an NPN junction structure.

In example embodiments, the semiconductor layer may include a plurality of 2D materials having different energy band gaps.

In example embodiments, the semiconductor device may be a tunneling device, and the semiconductor layer may be a tunneling layer.

In example embodiments, the semiconductor device may be a binary junction transistor (BJT), and the semiconductor layer may be a tunneling layer.

In example embodiments, the semiconductor device may be a barristor, and the semiconductor layer may be a channel layer.

In example embodiments, the semiconductor device may be a field effect transistor (FET), and the semiconductor layer may be a channel layer.

In example embodiments, the semiconductor device may be a memory device, and the semiconductor layer may be a charge trapping layer.

In example embodiments, the semiconductor device may be a diode.

In example embodiments, the semiconductor device may be a solar cell.

In example embodiments, the semiconductor device may be a photodetector.

According to example embodiments, a method of forming a 2D material element includes preparing a precursor solution including a precursor of a first metal chalcogenide-based material and a precursor of a second metal chalcogenide-based material; forming a thin film by applying the precursor solution onto a substrate; and forming a 2D material element including a first 2D material including the first metal chalcogenide-based material and a second 2D material including the second metal chalcogenide-based material from the thin film, wherein the second 2D material is chemically bonded to a side of the first 2D material.

The forming of the 2D material element from the thin film may include annealing the thin film.

The annealing may be performed at a temperature from about 300° C. to about 2000° C.

The forming of the 2D material element from the thin film may further include injecting a chalcogen-based material into a chamber in which the thin film is arranged.

According to example embodiments, a method of forming a 2D material element includes forming a thin film including a first metal oxide and a second metal oxide; and forming a 2D material element including a first 2D material, which includes a first metal chalcogenide-based material, and a second 2D material, which includes a second metal chalcogenide-based material, by forming the first metal chalcogenide-based material and the second metal chalcogenide-based material from the first metal oxide and the second metal oxide, respectively, wherein the second 2D material is chemically bonded to a side of the first 2D material.

The forming of the 2D material element from the thin film may include injecting a chalcogen-based material into a chamber in which the thin film is arranged; and annealing the thin film.

The annealing may be performed at a temperature from about 300° C. to about 2000° C.

According to example embodiments, a method of forming a 2D material element includes forming a thin film including a metal oxide; and forming a 2D material element including a first 2D material, which includes a first metal chalcogenide-based material, and a second 2D material, which includes a second metal chalcogenide-based material, by forming the first metal chalcogenide-based material and the second metal chalcogenide-based material from a first region and a second region of the thin film, respectively, wherein the second 2D material is chemically bonded to a side of the first 2D material.

The forming of the 2D material element from the thin film may include reacting the first region of the thin film with a first chalcogen-based material; and reacting the second region of the thin film with a second chalcogen-based material.

The forming of the 2D material element from the thin film may include forming a mask layer having an opening for exposing the first region on the thin film; and changing the first region exposed by the mask layer into the first 2D material.

The forming of the 2D material element from the thin film may include exposing the second region by removing the mask layer; and changing the second region of the thin film into the second 2D material.

According to example embodiments, a two-dimensional (2D) material element includes a first 2D material chemically bonded to a second 2D material. The first 2D material includes a first layer of a first metal chalcogenide. The second 2D material includes a second layer of a second metal chalcogenide. The first and second metal chalcogenides have one of different metal atoms and different chalcogen atoms.

In example embodiments, the first metal chalcogenide may include a first metal, the second metal chalcogenide may include a second metal, and at least one of the first and second metals may be a transition metal.

In example embodiments, the first metal chalcogenide and the second metal chalcogenide may each independently include: a metal atom including one of Mo, W, Nb, V, Ta, Ti, Zr, Hf, Tc, Re, Cu, Ga, In, Sn, Ge, and Pb; and a chalcogen atom including one of S, Se, and Te.

In example embodiments, the 2D material element may further include a third 2D material including a third layer of a third metal chalcogenide. The first and third 2D materials may be chemically bonded to opposite sides of the second 2D material, respectively. The third 2D material may have a different band gap than a band gap of the first and second 2D materials. The third 2D material may have a different conductivity type than a conductivity type of one of the first and second 2D materials.

In example embodiments, a semiconductor device may include a semiconductor layer including one of the above-described the 2D material elements.

BRIEF DESCRIPTION OF THE DRAWINGS

These and/or other aspects will become apparent and more readily appreciated from the following description of non-limiting embodiments, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
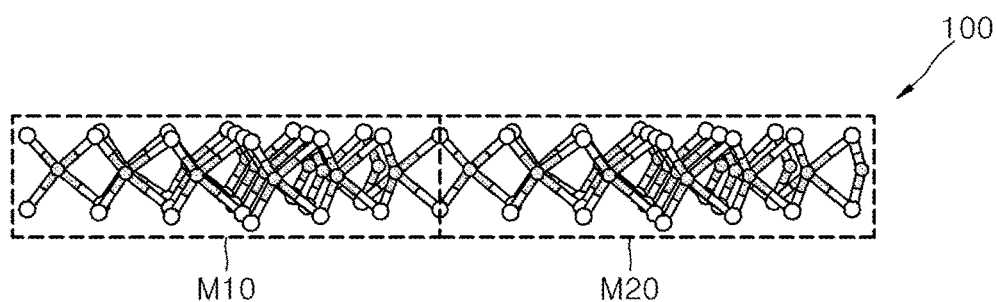
FIG. 1 is a diagram showing a two-dimensional (2D) material element according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a diagram showing a two-dimensional (2D) material element 100 according to example embodiments.

Referring to FIG. 1, the 2D material element 100 may include a first 2D material M10 and a second 2D material M20. The first 2D material M10 and the second 2D material M20 may be different materials. The first 2D material M10 may include a first metal chalcogenide-based material. The second 2D material M20 may include a second metal chalcogenide-based material. The first and second metal chalcogenide-based materials may be different transition metal dichalcogenide (TMDC) materials. The second 2D material M20 may be attached (bonded) to a side (side surface) of the first 2D material M10. Therefore, the first 2D material M10 and the second 2D material M20 may be laterally arranged. The first 2D material M10 may be chemically bonded to the second 2D material M20. In other words, the second 2D material M20 may be chemically bonded to a side of the first 2D material M10. The chemical bonding may be "covalent bonding." Therefore, the first 2D material M10 may be covalently bonded with the second 2D material M20. The first 2D material M10 and the second 2D material M20 may have an inter-atomic bonding structure having a continuous crystal structure at the bonding portion between the first 2D material M10 and the second 2D material M20.

The term "chemical bond" refers to a force (attraction) which is applied between atoms in a group of atoms or atom groups, such that the group may be considered as a single unit body. In other words, the term "chemical bond" refers to a bond between atoms, which forms a molecule or a crystal by connecting the atoms. Alternatively, the term "chemical bond" refers to a bonding of atoms for forming a chemical substance including two or more atoms. Such a chemical bond is basically induced by an electrostatic force between atoms, where a bonding force may vary according to bonding structures. The first 2D material M10 and the second 2D material M20 may be chemically bonded to each other, where the chemical bond may include covalent bonding. The covalent bonding is an attraction induced by electron pairs shared by two atoms constituting a bond and exhibits a relatively strong bonding force. Atoms of the first 2D material M10 and atoms of the second 2D material M20 may be chemically bonded to each other, and thus a continuous crystal structure may be formed at the bonding portion between the first 2D material M10 and the second 2D material M20. In other words, the 2D material element 100 may have a continuous crystal structure through the whole region thereof including the bonding portion between the first 2D material M10 and the second 2D material M20.

A comparative term to the term "chemical bond" is "physical contact." The term "physical contact" refers to two different material layers being in physically contact with each other while maintaining their own characteristics, where there is no inter-atomic bond (chemical bond) between the two material layers and the interface therebetween may have a discontinuous structure. The physical contact may be contact between surfaces due to a Van der Waals force. Therefore, in the case of a physical contact, an electric barrier may be formed at the interface, and thus charges (e.g., electrons) may not flow smoothly. However, according to example embodiments, the first 2D material M10 and the second 2D material M20 are chemically bonded to each other, and thus a continuous/smooth crystal structure may be formed at the bonding portion between the first 2D material M10 and the second 2D material M20. Therefore, without the interface issue between the first 2D material M10 and the second 2D material M20, charges (e.g., electrons) may flow/move smoothly. For example, charges (e.g., electrons) may flow smoothly through the bonding portion (interface) without tunneling occurring due to a barrier. Therefore, in example embodiments, the 2D material element 100 may include a plurality of different 2D materials and exhibit excellent physical/electric properties without any interface issue.

In FIG. 1, the first 2D material M10 may be the first metal chalcogenide-based material and the second 2D material M20 may be the second metal chalcogenide-based material. The first and second metal chalcogenide-based materials may be TMDC materials. At least one of the first and second metal chalcogenide-based materials may include a transition metal selected from a group consisting of Mo, W, Nb, V, Ta, Ti, Zr, Hf, Tc, and Re and a chalcogen atom selected from a group consisting of S, Se, and Te. The TMDC material may be expressed as $MX_2$, for example, where M denotes a transition metal, and X denotes a chalcogen atom. M may be Mo, W, Nb, V, Ta, Ti, Zr, Hf, Tc, or Re, whereas X may be S, Se, or Te. The TMDC material may be $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$, for example, but example embodiments are not limited thereto. The first and second metal chalcogenide-based materials may not be expressed as $MX_2$. For example, a compound of Cu(transition metal) and S (chalcogen atom) may be expressed as CuS which is a transition metal chalcogenide material. Since the CuS may be a 2D material, the CuS may be applied as the first or second metal chalcogenide-based material. According to example embodiments, the first and second metal chalcogenide-based materials may be chalcogenide-based materials including non-transition metals. The non-transition metal may be Ga, In, Sn, Ge, or Pb, for example. In other words, a compound including a non-transition metal, such as Ga, In, Sn, Ge, Pb, etc., and a chalcogen atom, such as S, Se, and Te, may be used as the first and second metal chalcogenide-based materials. The chalcogenide-based material including the non-transition metal may be $SnSe_2$, GaS, GaSe, GaTe, GeSe, $In_2Se_3$, $InSnS_2$, etc., for example. Therefore, at least one of the first and second metal chalcogenide-based materials may include a metal atom selected from a group consisting of Mo, W, Nb, V, Ta, Ti, Zr, Hf, Tc, Re, Cu, Ga, In, Sn, Ge, and Pb and a chalcogen atom selected from a group consisting of S, Se, and Te. However, the materials (atoms) stated above are merely examples, and any of various other materials (atoms) may be applied.

The first 2D material M10 and the second 2D material M20 may be "semiconductors." Therefore, the first 2D material M10 may be referred to as a first 2D semiconductor, the second 2D material M20 may be referred to as a second 2D semiconductor, and the 2D material element 100 may be referred to as a semiconductor element. In this case, one of the first and second 2D materials M10 and M20 may be a p-type semiconductor, and the other may be an n-type semiconductor. Alternatively, the first and second 2D materials M10 and M20 may have different energy band gaps.

Furthermore, at least one of the first and second 2D materials M10 and M20 may be doped with a p-type dopant or an n-type dopant. As the p-type or n-type dopant, a general p-type or n-type dopant for a 2D material may be used. For example, in example embodiments, a p-type dopant or an n-type dopant used for graphene or carbon nanotubes (CNT) may be applied to the 2D material element 100. The p-type dopant or the n-type dopant may be doped via ion implantation or chemical doping.

For example, a source of the p-type dopant may be an ionic liquid, such as $NO_2BF_4$, $NOBF_4$, or $NO_2SbF_6$, an acidic compound, such as HCl, $H_3PO_4$, $CH_3COOH$, $H_2SO_4$, or $HNO_3$, or an organic compound, such as dichlorodicyanoquinone (DDQ), oxone, dimyristoylphosphatidylinositol (DMPI), or trifluoromethanesulfoneimide. Alternatively, a source of the p-type dopant may be $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, etc. A source of the n-type dopant may be a reduction product of a substituted or unsubstituted nicotinamide; a reduction product of a compound which is chemically bonded to a substituted or unsubstituted nicotinamide; or a compound comprising at least two pyridinium moieties in which a nitrogen atom of at least one of the pyridinium moieties is reduced. For example, the source of the n-type dopant may include nicotinamide mononucleotide-H (NMNH), nicotinamide adenine dinucleotide-H (NADH), or nicotinamide adenine dinucleotide phosphate-H (NADPH) or may include viologen. Alternatively, the source of the n-type dopant may include a polymer, such as polyethylenimine (PEI). Alternatively, the n-type dopant may include an alkali metal, such as K and Li. However, the sources (materials) of the p-type dopant and the n-type dopant stated above are merely examples, and any of various other materials may be used.

Figure 2:
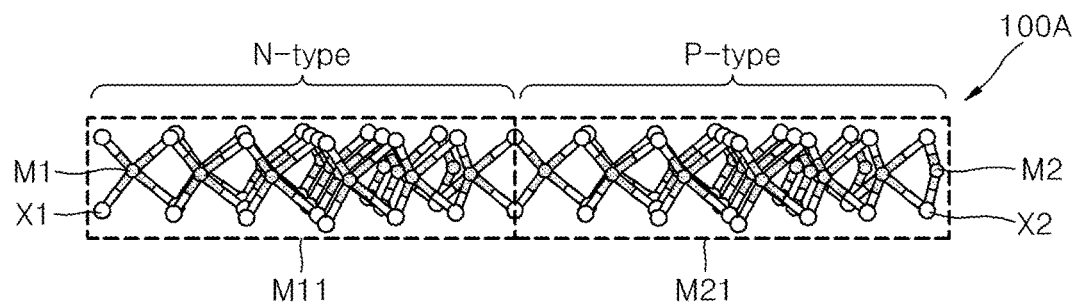
FIG. 2 is a diagram showing a 2D material element according to example embodiments.

FIG. 2 is a diagram showing a 2D material element 100A according to example embodiments. FIG. 2 relates to a case in which the 2D material element 100A has a PN junction structure.

Referring to FIG. 2, the 2D material element 100A may include a first 2D material M11 and a second 2D material M21. The first 2D material M11 and the second 2D material M21 may correspond to the first 2D material M10 and the second 2D material M20 of FIG. 1, respectively. The first 2D material M11 may be an n-type semiconductor, and the second 2D material M21 may be a p-type semiconductor. In this case, a first metal chalcogenide-based material of the first 2D material M11 and a second metal chalcogenide-based material of the second 2D material M21 may include different metal atoms from each other. Furthermore, the first metal chalcogenide-based material of the first 2D material M11 and the second metal chalcogenide-based material of the second 2D material M20 may include a same chalcogen atom. However, in some cases, the first 2D material M11 and the second 2D material M21 may include a same metal atom and also may include different chalcogen atoms.

The first 2D material M11 may include a first metal atom M1 and a first chalcogen atom X1, whereas the second 2D material M21 may include a second metal atom M2 and a second chalcogen atom X2. Here, the first and second metal atoms M1 and M2 may be transition metal atoms or non-transition metal atoms. The first metal atom M1 may be different from the second metal atom M2, whereas the first chalcogen atom X1 may be identical to the second chalcogen atom X2. When a metal included in a metal chalcogenide-based material is changed, a conductive type (p or n) thereof may be changed. Therefore, if the first 2D material M11 is an n-type material and the second 2D material M21 is a p-type material, metal atoms included in the first 2D material M11 and the second 2D material M21 may be different. However, in the case of some metal atoms, the conductive type (p or n) may be changed as a chalcogen atom bound to such a metal atom is changed. Therefore, in some cases, the first metal atom M1 may be identical to the second metal atom M2, and the first chalcogen atom X1 may be different from the second chalcogen atom X2.

The first 2D material M11 may include at least one of $MoS_2$, $MoSe_2$, $MoTe_2$, $WSe_2$, and $WTe_2$, which are metal chalcogenide-based materials having n-type semiconductor characteristic. The second 2D material M21 may include at least one of $WS_2$, $ZrS_2$, $ZrSe_2$, $HfS_2$, $HfSe_2$, and $NbSe_2$, which are metal chalcogenide-based materials having p-type semiconductor characteristic. For example, the first 2D material M11 may include $MoS_2$ having n-type semiconductor characteristic, whereas the second 2D material M21 may include $WS_2$ having p-type semiconductor characteristic. Mo and W are metals in a same group and a difference between atomic sizes thereof (difference between covalent radius: 0.08 Å) is significantly small as compared to an interval (1.54 Å) between the metal (Mo) and S. Therefore, even if the central metal atom is changed, lattice mismatch may rarely occur. Therefore, when $MoS_2$ and $WS_2$ are chemically bonded to each other, there may be little or no lattice mismatch at the bonding portion therebetween. Here, Mo and W have a same atomic radius of 139 picometers (pm), a covalent radius of Mo is 154±5 pm, and a covalent radius of W is 162±7 pm.

Table 1 below shows examples of metal chalcogenide-based materials having n-type semiconductor property and metal chalcogenide-based materials having p-type semiconductor property.

TABLE 1

| Category | Examples of Metal Chalcogenide-Based Materials |
| --- | --- |
| n-type semiconductor | $MoS_2$, $MoSe_2$, $MoTe_2$, $WSe_2$, $WTe_2$ |
| p-type semiconductor | $WS_2$, $ZrS_2$, $ZrSe_2$, $HfS_2$, $HfSe_2$, $NbSe_2$ |

At least one of the first and second 2D materials M11 and M21 may be doped with a p-type dopant or an n-type dopant. If the first 2D material M11 is an n-type semiconductor, the first 2D material M11 may be doped with an n-type dopant and, if necessary, may be doped with a p-type dopant. Similarly, if the second 2D material M21 is a p-type semiconductor, the second 2D material M21 may be doped with a p-type dopant or may be doped with an n-type dopant. For example, if the second 2D material M21 is $WS_2$ (p-type), the second 2D material M21 may be doped with $AuCl_3$, which is a p-type dopant, or K, which is an n-type dopant. In other words, a 2D material may be doped with a same semiconductor type dopant or an opposite semiconductor type dopant. By being doped with an opposite semiconductor type dopant, the semiconductor type of a 2D material may be changed.

Figure 3:
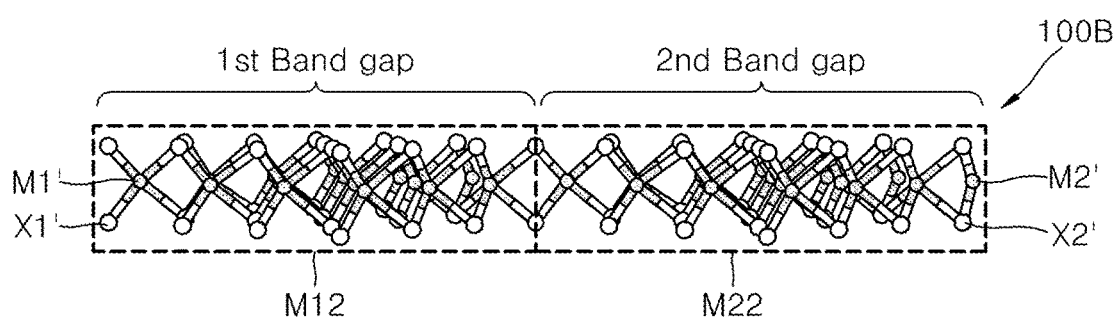
FIG. 3 is a diagram showing a 2D material element according to example embodiments.

FIG. 3 is a diagram showing a 2D material element 100B according to example embodiments. FIG. 3 relates to a case in which the 2D material element 100B includes a plurality of 2D materials M12 and M22 having different energy band gaps.

Referring to FIG. 3, the 2D material element 100B may include a first 2D material M12 and a second 2D material M22. The first 2D material M12 and the second 2D material M22 may correspond to the first 2D material M10 and the second 2D material M20 of FIG. 1, respectively. The first 2D material M12 and the second 2D material M22 may have different energy band gaps (referred to hereinafter as 'band gaps'). In other words, the first 2D material M12 may have a first band gap, whereas the second 2D material M22 may have a second band gap different from the first band gap. In this case, a first metal chalcogenide-based material of the first 2D material M12 and a second metal chalcogenide-based material of the second 2D material M22 may include different chalcogen atoms from each other. Furthermore, the first metal chalcogenide-based material of the first 2D material M12 and the second metal chalcogenide-based material of the second 2D material M22 may include a same metal atom. However, in some cases, the first 2D material M12 and the second 2D material M22 may include different metal atoms.

The first 2D material M12 may include a first metal atom M1' and a first chalcogen atom X1', and the second 2D material M22 may include a second metal atom M2' and a second chalcogen atom X2'. Here, the first chalcogen atom X1' may be different from the second chalcogen atom X2'. The first metal atom M1' may be identical to or different from the second metal atom M2'. If a chalcogen atom of a metal chalcogenide-based material is changed, the band gap of the metal chalcogenide-based material may be changed. Therefore, by chemically bonding the first 2D material M12 and the second 2D material M22 including different chalcogen atoms to each other, the 2D material element 100B including a plurality of regions with different band gaps may be embodied.

For example, the first 2D material M12 may include one from among $MoS_2$, $MoSe_2$, and $MoTe_2$, whereas the second 2D material M22 may include another one from among $MoS_2$, $MoSe_2$, and $MoTe_2$. Alternatively, the first 2D material M12 may include one from among $WS_2$, $WSe_2$, and $WTe_2$, whereas the second 2D material M22 may include another one from among $WS_2$, $WSe_2$, and $WTe_2$. Band gaps and semiconductor types (conductive types) of $MoS_2$, $MoSe_2$, $MoTe_2$, $WS_2$, $WSe_2$, and $WTe_2$ are shown in Table 2 below.

TABLE 2

| Materials | Band Gaps (eV) | Semiconductor Types |
| --- | --- | --- |
| $MoS_2$ | 1.88 | n-type |
| $MoSe_2$ | 1.57 | n-type |
| $MoTe_2$ | 1.17 | n-type |
| $WS_2$ | 1.90 | p-type |
| $WSe_2$ | 1.66 | n-type |
| $WTe_2$ | 1.20 | n-type |

Meanwhile, the band gap of $ReSe_2$ may be 1.30 eV, the band gap of $SnSe_2$ may be 1.40 eV, the band gap of GaS may be 2.40 eV, the band gap of GaSe may be 2.30 eV, the band gap of GaTe may be 2.00 eV, the band gap of GeSe may be 1.60 eV, and the band gap of $In_2Se_3$ may be 1.41 eV. The band gap of bulk CuS may be 1.60 eV, and the band gap of bulk $InSnS_2$ may be 1.45 eV. One of $ReSe_2$, $SnSe_2$, GaS, GaSe, GaTe, GeSe, $In_2Se_3$, CuS, and $InSnS_2$ may be applied as the first 2D material M12 or the second 2D material M22.

In example embodiments, if a composition of a metal chalcogenide-based material is varied in a same planar structure, the 2D material element 100B including a plurality of regions having different band gaps (that is, the first and second 2D materials M12 and M22) may be embodied. In this case, since the first 2D material M12 and the second 2D material M22 are chemically bonded to each other, there may be little or no electric barrier at the interface therebetween. Even if there is an electric barrier at the interface between the first 2D material M12 and the second 2D material M22, since the thickness of the electric barrier is as thin as one atom, the electric barrier may not actually function as a barrier. Therefore, the 2D material element 100B may exhibit excellent properties without any interface issue. On the contrary, if two different materials (semiconductors) physically contact each other, band bending occurs at the interface therebetween and an electric barrier having an effective thickness is formed thereat. As a result, charges (e.g., electrons) may not flow smoothly.

Additionally, by doping at least one of the first 2D material M12 and the second 2D material M22 of FIG. 3 with a p-type dopant or an n-type dopant, properties of the first 2D material M12 and the second 2D material M22 may be additionally controlled. Types of the p-type dopant and the n-type dopant may be identical to those described above with reference to FIG. 1.

Although FIGS. 1 through 3 show the 2D material elements 100, 100A, and 100B having single-layer structures (2D plane structures), a structure in which the single-layer structures (2D plane structures) are repeatedly stacked may be embodied. An example thereof is shown in FIG. 4.

Figure 4:
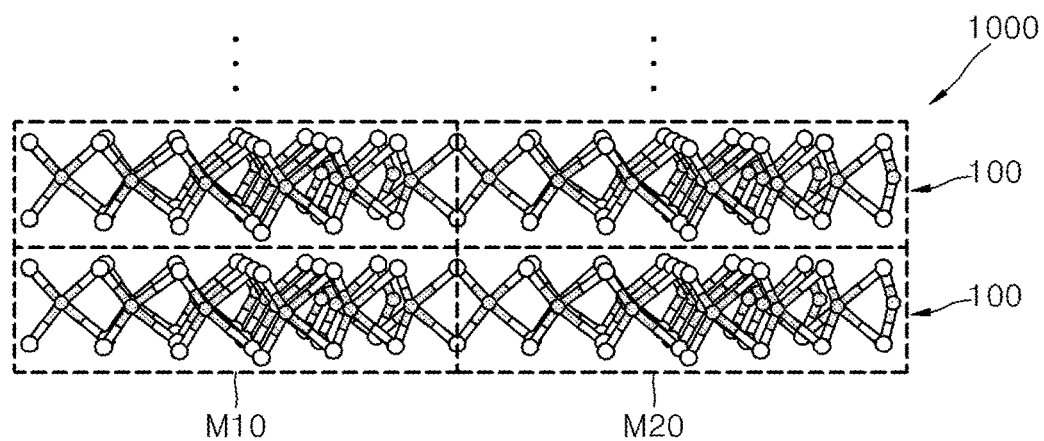
FIG. 4 is a diagram showing a 2D material element according to example embodiments.

Referring to FIG. 4, a 2D material element 1000 may have a structure in which the 2D material elements 100 having the single-layer structure (2D plane structure) of FIG. 1 (referred to hereinafter as 'unit material layers 100') are repeatedly stacked. For example, a few layers (up to 10 layers) of the unit material layers 100 may be stacked. Alternatively, up to about 100 unit material layers 100 may be stacked. The first 2D material M10 of the unit material layer 100 may be identical to the first 2D material M11 of FIG. 2 or the first 2D material M12 of FIG. 3. Furthermore, the second 2D material M20 of the unit material layer 100 may be identical to the second 2D material M21 of FIG. 2 or the second 2D material M22 of FIG. 3.

Even if the unit material layers 100 are repeatedly stacked, properties of 2D materials may be maintained. In terms of electric structure, a 2D material may be defined as a material of which density of state (DOS) depends on quantum well behavior. Since in the 2D material element 1000 in which the plurality of unit material layers 100 are stacked (to about 100 layers), DOS may depend on quantum well behavior, and thus the 2D material element 1000 of FIG. 4 may be referred to as a "2D material."

Furthermore, although FIG. 4 shows the structure in which the first 2D material M10 is stacked on the first 2D material M10 and the second 2D material M20 is stacked on the second 2D material M20, the second 2D material M20 may be stacked on the first 2D material M10 and the first 2D material M10 may be stacked on the second 2D material M20 according to example embodiments. In other words, a structure in which the first 2D material M10 and the second 2D material M20 are randomly stacked may be embodied as well.

Furthermore, although FIGS. 1 through 4 show cases in which "chalcogen atoms" exist at the boundaries between the first 2D materials M10, M11, and M12 and the second 2D materials M20, M21, and M22, "metal atoms" may exist at the boundaries in lieu of the "chalcogen atoms." In other words, the first 2D materials M10, M11, and M12 and the second 2D materials M20, M21, and M22 may be separated by predetermined or given "metal atoms" therebetween.

Figure 5:
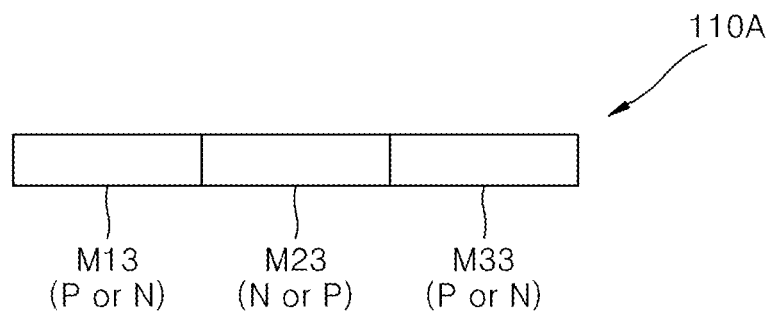
FIGS. 5 and 6 are cross-sectional diagrams of 2D material elements according to example embodiments.

FIG. 5 is a cross-sectional view of a 2D material element 110A according to example embodiments.

Referring to FIG. 5, the 2D material element 110A may include first through third 2D materials M13, M23, and M33. The first and third 2D materials M13 and M33 may be chemically bonded to both sides (opposite sides) of the second 2D material M23. At least two of the first through third 2D materials M13, M23, and M33 may have different semiconductor types (conductive types). The first 2D material M13 may correspond to the first 2D material M11 of FIG. 2 and the second 2D material M23 may correspond to the second 2D material M21 of FIG. 2, or vice versa. The third 2D material M33 may have the same materials and properties as the first 2D material M13. Therefore, the 2D material element 110A may have a PNP structure or an NPN structure. In other words, the first and third 2D materials M13 and M33 may be p-type semiconductors and the second 2D material M23 may be an n-type semiconductor, or vice versa. Although not shown in FIG. 5, at least one other 2D material may be further arranged at a side of the first 2D material M13 or the third 2D material M33.

Figure 6:
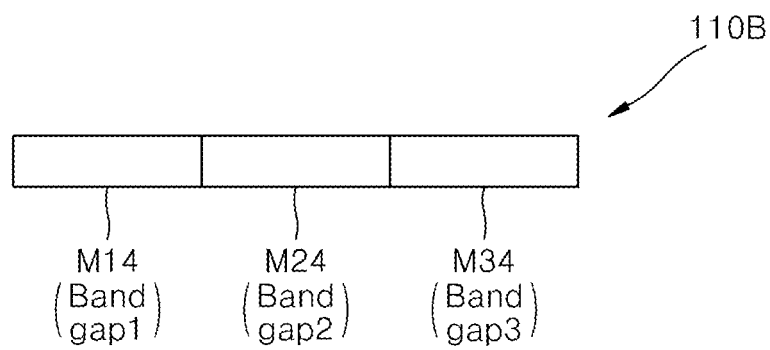

FIG. 6 is a cross-sectional view of a 2D material element 110B according to example embodiments.

Referring to FIG. 6, the 2D material element 110B may include first through third 2D materials M14, M24, and M34. The first and third 2D materials M14 and M34 may be chemically bonded to both sides (opposite sides) of the second 2D material M24. At least two of the first through third 2D materials M14, M24, and M34 may have different band gaps. The first through third 2D materials M14, M24, and M34 may have different band gaps (first through third band gaps). One from among the first through third 2D materials M14, M24, and M34 may correspond to the first 2D material M12 of FIG. 3, and the other one from among the first through third 2D materials M14, M24, and M34 may correspond to the second 2D material M22 of FIG. 3. The third 2D material M34 may be a material different from the first and second 2D materials M14 and M24. For example, the 2D material element 110B may have either a $MoS_2$—$MoSe_2$—$MoTe_2$ structure or a $WS_2$—$WSe_2$—$WTe_2$ structure. Although not shown in FIG. 6, at least one other 2D material may be further arranged at a side of the first 2D material M14 or the third 2D material M34.

The unit structures (unit material layers) of FIGS. 5 and 6 may be repeatedly stacked as described above with reference to FIG. 4.

In 2D material elements according to example embodiments, heterogeneous 2D materials may form various patterns. Examples thereof are shown in FIGS. 7 through 10.

Figure 7:
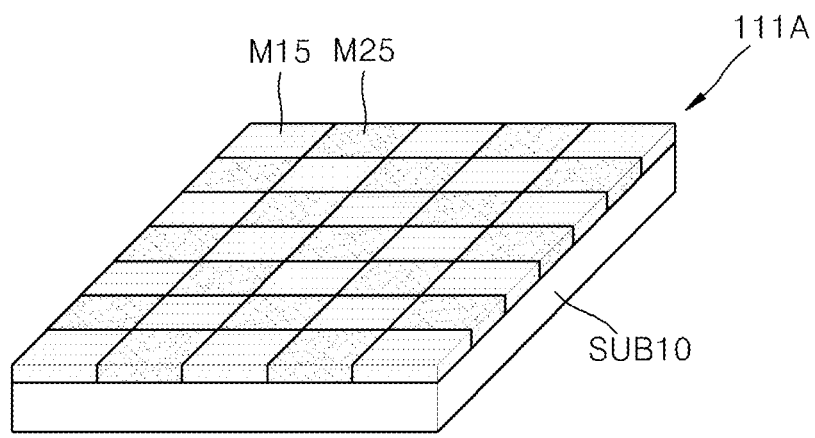
FIGS. 7 through 10 are perspective diagrams of 2D material elements according to example embodiments.
Figure 23:
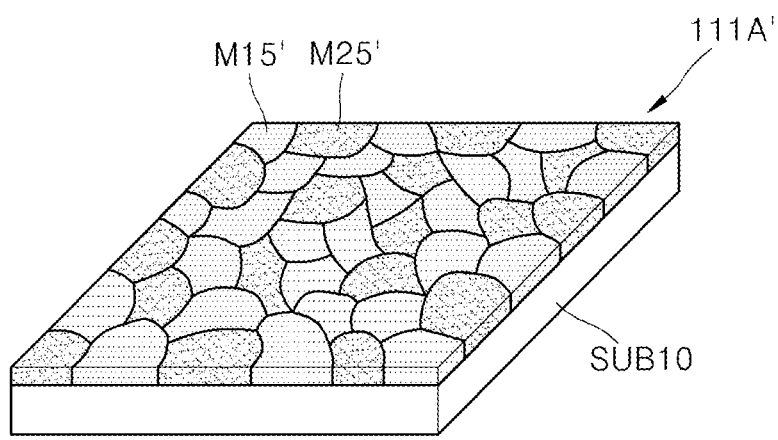
FIG. 23 is a perspective diagram of a 2D material element according to example embodiments.
Figure 24:
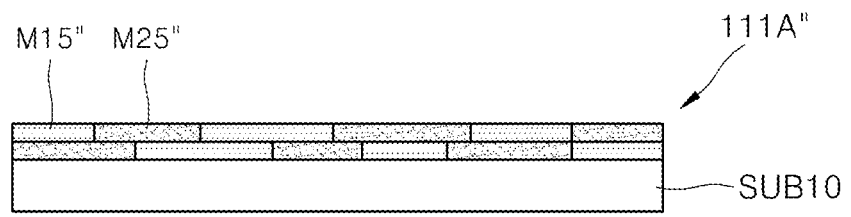
FIG. 24 is a cross-sectional diagram of a 2D material element according to example embodiments.

FIG. 7 is a perspective view of a 2D material element 111A according to example embodiments. Referring to FIG. 7, the 2D material element 111A may be disposed on a substrate SUB10. The 2D material element 111A may have a structure in which a plurality of first 2D materials M15 and a plurality of second 2D materials M25 are 2-dimensionally arranged. The first 2D material M15 and the second 2D material M25 may be nanoscale or microscale domains. For example, each of the first 2D material M15 and the second 2D material M25 may have a width equal to or greater than 10 nm. Although FIG. 7 shows that the first 2D material M15 and the second 2D material M25 have rectangular shapes and are regularly arranged, it is merely an example, and the shapes and arrangement of the first and second 2D materials M15 and M25 may vary. There is no limit to the shapes of the first and second 2D materials M15 and M25 and the first and second 2D materials M15 and M25 may be irregularly (randomly) arranged. For example, as shown in FIG. 23, a 2D material element 111A' may have a structure in which a plurality of first 2D materials M15' and a plurality of second 2D materials M25' are randomly and irregularly arranged. The first and second 2D materials M15' and M25' may have irregular shapes. In addition, according to example embodiments, a 2D material element may have a random structure in a vertical direction. For example, as shown in FIG. 24, a 2D material element 111A'' may have a structure in which a plurality of first 2D materials M15'' and a plurality of second 2D materials M25'' are randomly and irregularly arranged in a vertical and/or horizontal direction.

The first and second 2D materials M15 and M25 of FIG. 7 may correspond to the first and second 2D materials M11 and M21 of FIG. 2, respectively. Therefore, the first 2D material M15 may be an n-type semiconductor, the second 2D material M25 may be a p-type semiconductor, and the 2D material element 111A may have a PN junction structure.

Figure 8:
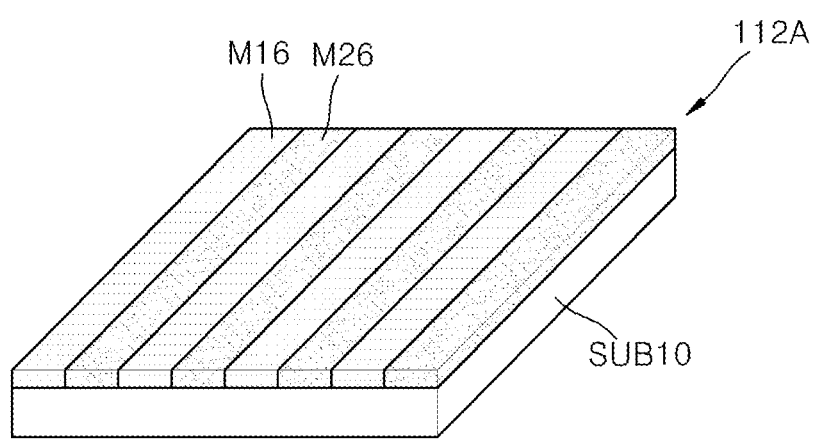

FIG. 8 is a perspective view of a 2D material element 112A according to example embodiments. Referring to FIG. 8, the 2D material element 112A may have a structure in which first 2D materials M16 and second 2D materials M26 are alternately and repeatedly arranged. The first and second 2D materials M16 and M26 may have linear shapes. Therefore, the 2D material element 112A may have a stripe pattern. The first and second 2D materials M16 and M26 may correspond to the first and second materials M11 and M21 of FIG. 2, respectively. Therefore, the first 2D material M16 may be an n-type semiconductor, the second 2D material M26 may be a p-type semiconductor, and the 2D material element 112A may have a PN junction structure.

Figure 9:
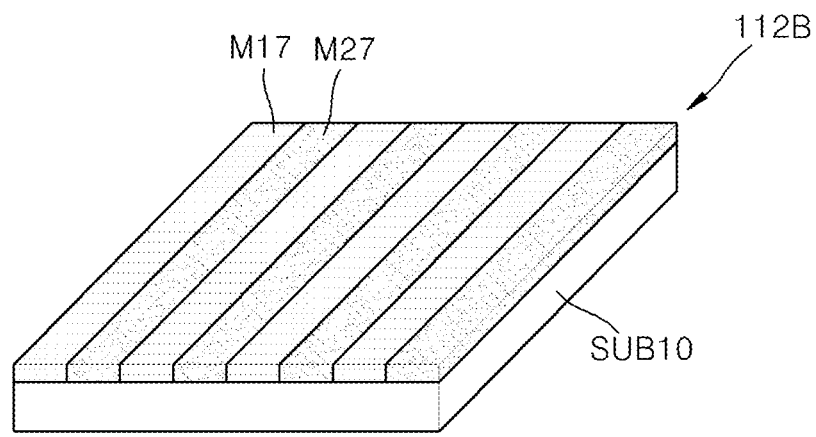

FIG. 9 is a perspective view of a 2D material element 112B according to example embodiments. The 2D material element 112B of FIG. 9 may be similar to the 2D material element 112A of FIG. 8. However, in FIG. 9, the first and second 2D materials M17 and M27 may correspond to the first and second 2D materials M12 and M22 of FIG. 3, respectively. Therefore, the 2D material element 112B may have a structure in which the 2D materials M17 and M27 having different band gaps are alternately and repeatedly arranged.

Figure 10:
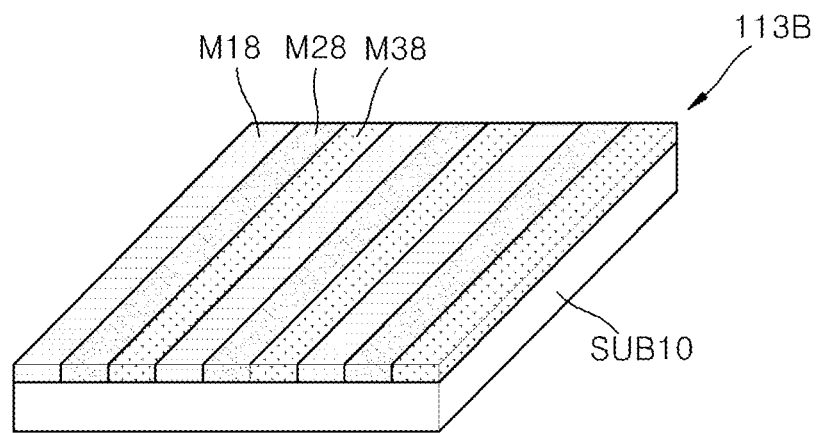

FIG. 10 is a perspective view of a 2D material element 113B according to example embodiments. The 2D material element 113B of FIG. 10 may include first through third 2D materials M18, M28, and M38. The first through third 2D materials M18, M28, and M38 may be repeatedly arranged in a lateral direction. The first through third 2D materials M18, M28, and M38 may have different band gaps. For example, the first through third 2D materials M18, M28, and M38 may correspond to the first through third 2D materials M14, M24, and M34 of FIG. 6, respectively.

The patterns shown in FIGS. 7 through 10 are merely examples, and shapes and sizes of patterns may vary.

Hereinafter, a method of forming a 2D material element according to example embodiments will be described.

Figure 11A:
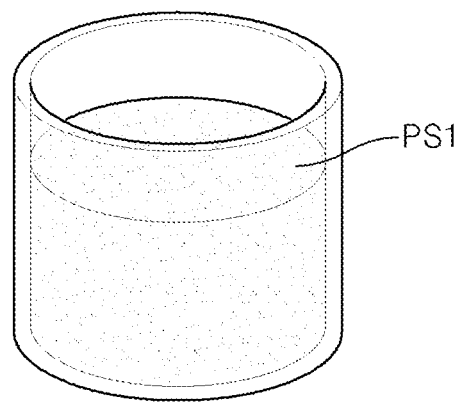
FIGS. 11A through 11C are perspective diagrams showing a method of forming a 2D material element according to example embodiments.
Figure 11B:
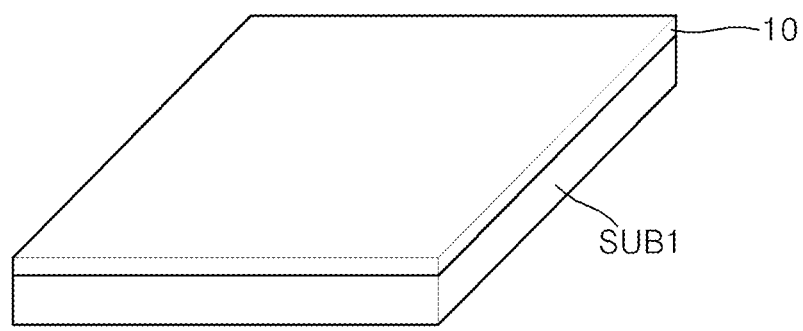
Figure 11C:
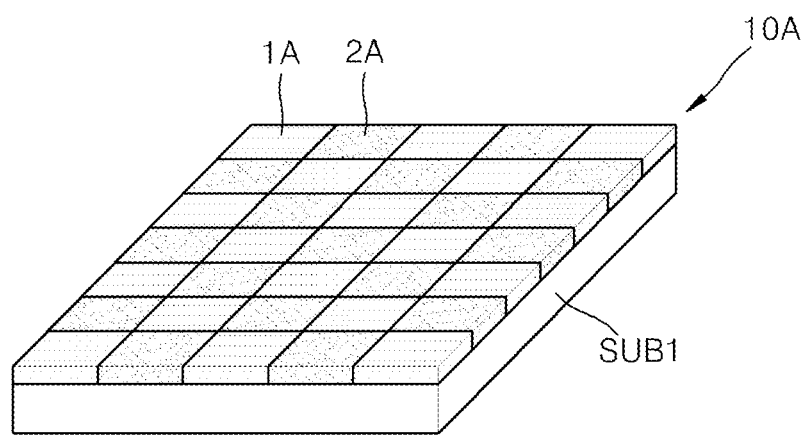

FIGS. 11A through 11C are perspective diagrams showing a method of forming a 2D material element according to example embodiments.

Referring to FIG. 11A, a precursor solution PS1 may be prepared. The precursor solution PS1 may include a precursor of a first metal chalcogenide-based material (referred to hereinafter as 'first precursor') and a precursor of a second metal chalcogenide-based material (referred to hereinafter as 'second precursor'). For example, the precursor solution PS1 may be prepared by mixing the first precursor and the second precursor with a designated solvent (organic solvent). The first precursor may be, for example, a precursor of a metal chalcogenide-based material having n-type semiconductor characteristic, whereas the second precursor may be, for example, a precursor of a metal chalcogenide-based material having p-type semiconductor characteristic. The first precursor may be a precursor of one from among $MoS_2$, $MoSe_2$, $MoTe_2$, $WSe_2$, and $WTe_2$ having n-type semiconductor characteristic, whereas the second precursor may be a precursor of one from among $WS_2$, $ZrS_2$, $ZrSe_2$, $HfS_2$, $HfSe_2$, and $NbSe_2$ having p-type semiconductor characteristic. For example, $(NH_4)_2MoS_4$ may be used as a precursor (the first precursor) of the $MoS_2$, and $(NH_4)_2WS_4$ may be used as a precursor (the second precursor) of the $WS_2$. Meanwhile, the solvent (organic solvent) may be dimethylformamide (DMF), for example. The precursor solution PS1 may be fabricated by mixing $(NH_4)_2MoS_4$ and $(NH_4)_2WS_4$ (0.125 wt % each) into the DMF. However, it is merely an example, and materials of the first and second precursors, types of solvents, and mixing ratios may vary.

Referring to FIG. 11B, the precursor solution (PS1 of FIG. 11A) may be applied onto a substrate SUB1, thereby forming a thin film 10. The substrate SUB1 may be a semiconductor substrate, a conductive substrate, or an insulation substrate. For example, the substrate SUB1 may include a semiconductor, such as silicon, a conductor (metal), such as Cu, Ni, Fe, Co, Pt, or Ru, or an insulator, such as silicon oxide or sapphire. Materials for forming the substrate SUB1 are not limited, and thus various types of substrates may be used. The thin film 10 may be formed by using any of various coating methods, such as spin coating, dip coating, and bar coating. The thin film 10 may have a nanometer-level (nanoscale) thickness. Most of the solvent as described above with reference to FIG. 11A may be removed from the thin film 10 during or after formation of the thin film 10.

Referring to FIG. 11C, a 2D material layer 10A may be formed from the thin film (10 of FIG. 11B). The 2D material layer 10A may consist of a first 2D material 1A including a first metal chalcogenide-based material formed from the first precursor and a second 2D material 2A including a second metal chalcogenide-based material formed from the second precursor. The first 2D material 1A and the second 2D material 2A may be chemically bonded to each other. The first 2D material 1A and the second 2D material 2A may correspond to the first 2D material M11 and the second 2D material M21 of FIG. 2 or the first 2D material M15 and the second 2D material M25 of FIG. 7, respectively. The first 2D material 1A may be an n-type semiconductor and the second 2D material 2A may be a p-type semiconductor, or vice versa. The 2D material layer 10A may have a PN junction structure.

To form the 2D material layer 10A in which the plurality of 2D materials 1A and 2A are chemically bonded from the thin film 10, an annealing (heat treatment) process may be performed with respect to the thin film 10. The annealing process may be performed at a temperature in the range of about 300° C. to about 2000° C. Via the annealing process, the first metal chalcogenide-based material may be formed from the first precursor, and the second metal chalcogenide-based material may be formed from the second precursor. For example, if the first precursor is $(NH_4)_2MoS_4$, $(NH_4)_2$ may be removed (vaporized) from $(NH_4)_2MoS_4$ and $MoS_4$ may be changed to $MoS_2$. Furthermore, if the second precursor is $(NH_4)_2WS_4$, $(NH_4)_2$ may be removed (vaporized) from $(NH_4)_2WS_4$ and $WS_4$ may be changed to $WS_2$. In this case, the first 2D material 1A may be $MoS_2$, and the second 2D material 2A may be $WS_2$. Amounts/areas of the first 2D material 1A and the second 2D material 2A formed in an operation shown in FIG. 11C may be adjusted by controlling contents of the first precursor and the second precursor added to the precursor solution PS1 in the operation of FIG. 11A. Although FIG. 11C shows that the first 2D material 1A and the second 2D material 2A have rectangular shapes and are regularly arranged, it is merely an example, and shapes of the first 2D material 1A and the second 2D material 2A are not limited, and the first 2D material 1A and the second 2D material 2A may be irregularly (randomly) arranged. For example, as shown in FIG. 23, a 2D material element 111A' may have a structure in which a plurality of first 2D materials M15' and a plurality of second 2D materials M25' are randomly and irregularly arranged. The first and second 2D materials M15' and M25' may have irregular shapes. In addition, according to example embodiments, a 2D material element may have a random structure in a vertical direction. For example, as shown in FIG. 24, a 2D material element 111A" may have a structure in which a plurality of first 2D materials M15" and a plurality of second 2D materials M25" are randomly and irregularly arranged in a vertical and/or horizontal direction.

During the annealing process with respect to the thin film 10, a designated or given chalcogen-based material may be injected into a chamber in which the thin film 10 is arranged. The chalcogen-based material may include one of S, Se, and Te, for example. If the first and second precursors are $(NH_4)_2MoS_4$ and $(NH_4)_2WS_4$, respectively, the chalcogen-based material may include sulfur (S). By injecting the chalcogen-based material during the annealing process, the first 2D material 1A and the second 2D material 2A may be formed more easily. Furthermore, an additional annealing (heat treatment) process may be performed. The additional annealing process may also be performed at a temperature in the range of about 300° C. to about 2000° C.

Furthermore, after performing a first annealing process in the operation of changing the thin film 10 of FIG. 11B to the 2D material layer 10A of FIG. 11C, a chalcogen-based material injecting process and a second annealing process may be further performed. In other words, after the first annealing process is performed, a second annealing process may be performed while injecting a chalcogen-based material into a reaction chamber (annealing chamber). The chalcogen-based material may include one of S, Se, and Te, for example. The first and second annealing processes may be performed at a temperature in the range of about 300° C. to about 2000° C.

Figure 12A:
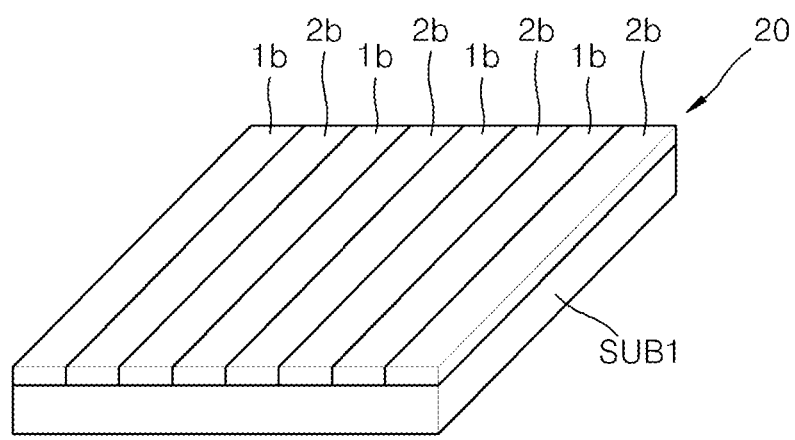
FIGS. 12A and 12B are perspective diagrams showing a method of forming a 2D material element according to example embodiments.
Figure 12B:
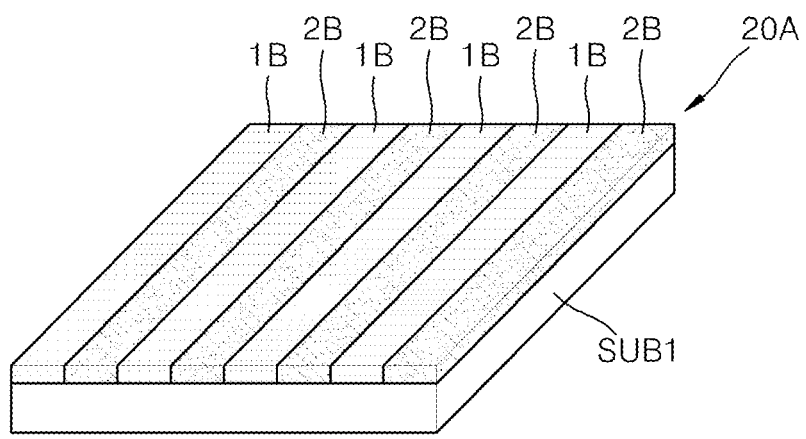

FIGS. 12A and 12B are perspective diagrams showing a method of forming a 2D material element according to example embodiments.

Referring to FIG. 12A, a thin film 20 including a first metal oxide 1b and a second metal oxide 2b may be formed on a substrate SUB1. A plurality of the first metal oxides 1b and a plurality of the second metal oxides 2b may form a designated or given pattern. For example, as shown in FIG. 12A, the first metal oxides 1b and the second metal oxides 2b may form a stripe pattern. The first metal oxide 1b may include an oxide of one from among metals including Mo, W, Nb, V, Ta, Ti, Zr, Hf, Tc, Re, Cu, Ga, In, Sn, Ge, and Pb. The second metal oxide 2b may include an oxide of another one from among the metals including Mo, W, Nb, V, Ta, Ti, Zr, Hf, Tc, Re, Cu, Ga, In, Sn, Ge, and Pb. For example, the first metal oxide 1b may be formed of $MoO_3$, and the second metal oxide 2b may be formed of $WO_3$. The thin film 20 may be formed by forming a pattern consisting of the plurality of first metal oxides 1b on the substrate SUB1 and forming the second metal oxides 2b between the first metal oxides 1b. Here, photolithography, electron-beam lithography, or nano-imprinting process may be performed therefor. Alternatively, the thin film 20 may be formed via sublimation, evaporation, and/or sputtering of an oxide solid, or may be formed by depositing a metal thin film and oxidizing the metal thin film. If necessary, during formation of the thin film 20, a chemical mechanical polishing (CMP) operation or an etch-back operation may also be performed.

Referring to FIG. 12B, a first metal chalcogenide-based material and a second metal chalcogenide-based material may be formed from the first metal oxide 1b and the second metal oxide 2b, respectively, and a 2D material layer 20A, which includes a first 2D material 1B including the first metal chalcogenide-based material and a second 2D material 2B including the second metal chalcogenide-based material, may be formed. The second 2D material 2B may be chemically bonded to a side (side surface) of the first 2D material 1B. The first 2D material 1B and the second 2D material 2B may correspond to the first 2D material M11 and the second 2D material M21 of FIG. 2 or the first 2D material M16 and the second 2D material M26 of FIG. 8, respectively. The first 2D material 1B may be an n-type semiconductor and the second 2D material 2B may be a p-type semiconductor, or vice versa. The 2D material layer 20A may have a PN junction structure.

To form the 2D material layer 20A, an annealing process may be performed while injecting a chalcogen-based material into a reaction chamber (annealing chamber). The chalcogen-based material may include one of S, Se, and Te, for example. If the first 2D material 1B and the second 2D material 2B are $MoO_3$ and $WO_3$, respectively, and metal chalcogenide-based materials to be formed are $MoS_2$ and $WS_2$, the chalcogen-based material may include sulfur (S). In other words, when an annealing process is performed with respect to the thin film 20 while supplying S into the reaction chamber (annealing chamber), $MoO_3$ and $WO_3$ may be changed to $MoS_2$ and $WS_2$, respectively. $MoS_2$ is an example of the first 2D material 1B, and $WS_2$ is an example of the second 2D material 2B. Based on the first metal oxide 1b and the second metal oxide 2b and the chalcogen-based material, types of the first 2D material 1B and the second 2D material 2B may vary. The annealing process may be performed at a temperature in the range of about 300° C. to about 2000° C., for example. Next, an additional annealing process may be performed. The additional annealing process may also be performed at a temperature in the range of about 300° C. to about 2000° C., but is not limited thereto In FIG. 12A, patterns formed by the first and second metal oxides 1b and 2b may vary, and thus patterns formed by the first 2D material 1B and the second 2D material 2B in FIG. 12B may also vary. Therefore, a 2D material layer having a desired pattern may be formed.

Although FIGS. 12A and 12B shows a method according to example embodiments in which the first and second 2D materials 1B and 2B are obtained by forming the first and second chalcogenide-based materials from the first and second metal oxides 1b and 2b, the first and second metal oxides 1b and 2b may be replaced with first and second metals, respectively. In other words, the first and second 2D materials 1B and 2B may be obtained by forming first and second chalcogenide-based materials from the first and second metals, wherein the first and second metals may be different from each other. For forming the first and second chalcogenide-based materials, the first and second metals may be reacted with chalcogen-based material. The first metal may include one of Mo, W, Nb, V, Ta, Ti, Zr, Hf, Tc, Re, Cu, Ga, In, Sn, Ge, and Pb, and the second metal may include another one of Mo, W, Nb, V, Ta, Ti, Zr, Hf, Tc, Re, Cu, Ga, In, Sn, Ge, and Pb, for example. The chalcogen-based material may include one of S, Se, and Te, for example.

FIGS. 13A through 13E are perspective diagrams showing a method of forming a 2D material element according to example embodiments.

Figure 13A:
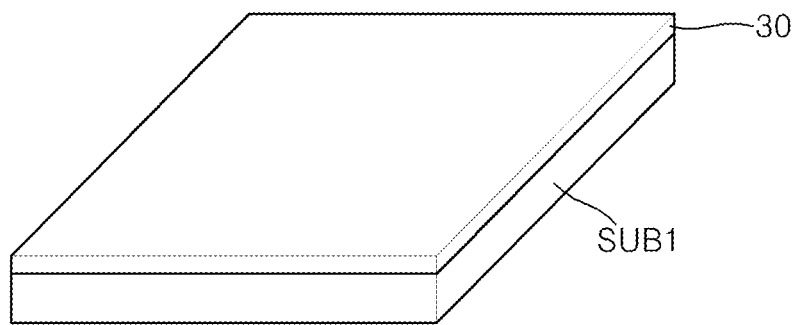
FIGS. 13A through 13E are perspective diagrams showing a method of forming a 2D material element according to example embodiments.

Referring to FIG. 13A, a thin film 30 including a metal oxide may be formed on a substrate SUB1. The thin film 30 may be a metal oxide film. The metal oxide may include an oxide of one from among metals including Mo, W, Nb, V, Ta, Ti, Zr, Hf, Tc, Re, Cu, Ga, In, Sn, Ge, and Pb. As an example, the metal oxide may include $MoO_3$.

Figure 13B:
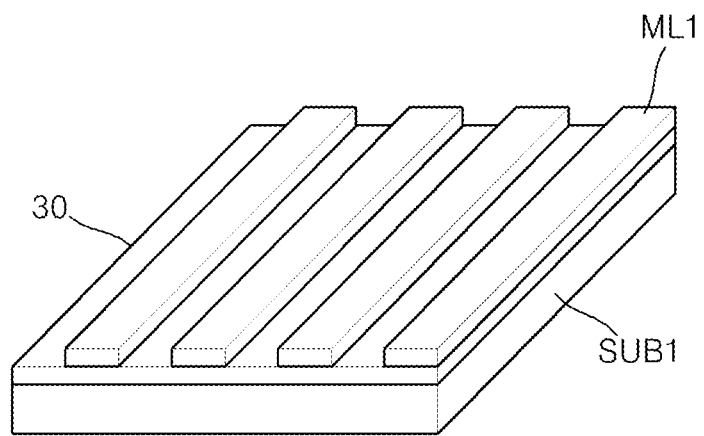

Referring to FIG. 13B, a mask layer ML1 may be formed on the thin film 30. The mask layer ML1 may have a designated or given patterned structure for exposing portions of the thin film 30. The mask layer ML1 may be formed of a metal and may have stripe-like exposing regions, for example. However, the shape of the mask layer ML1 is not limited thereto and may vary.

Figure 13C:
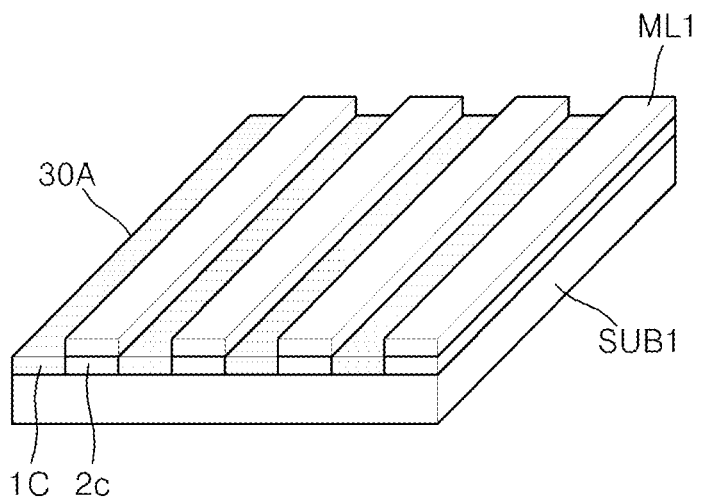

Referring to FIG. 13C, a first 2D material 1C may be formed by changing a metal oxide at exposed regions of the thin film 30 that are not covered by the mask layer ML1 into a first metal chalcogenide-based material. As an annealing process is performed while injecting a first chalcogen-based material into a reaction chamber (annealing chamber), the metal oxide at the exposed portions of the thin film 30 reacts with the first chalcogen-based material, and thus the first 2D material 1C may be formed. The annealing process may be performed at a temperature in the range of about 300° C. to about 2000° C., but is not limited thereto. The first chalcogen-based material may include one of S, Se, and Te, for example. If the metal oxide is $MoO_3$ and the metal chalcogenide-based material to be formed is $MoS_2$, the first chalcogen-based material may include sulfur (S). In other words, when an annealing process is performed with respect to the thin film 30 while supplying S into the reaction chamber (annealing chamber), the exposed portion of the thin film 30A may be changed to $MoS_2$. The thin film at which the first 2D material 1C is formed is denoted by the reference numeral 30A. In the thin film 30A, regions covered by the mask layer ML1 may still be metal oxide regions. The regions are denoted by the reference numeral 2c.

Next, the mask layer ML1 may be removed. The structure of FIG. 13C without the mask layer ML1 may be as shown in FIG. 13D.

Figure 13D:
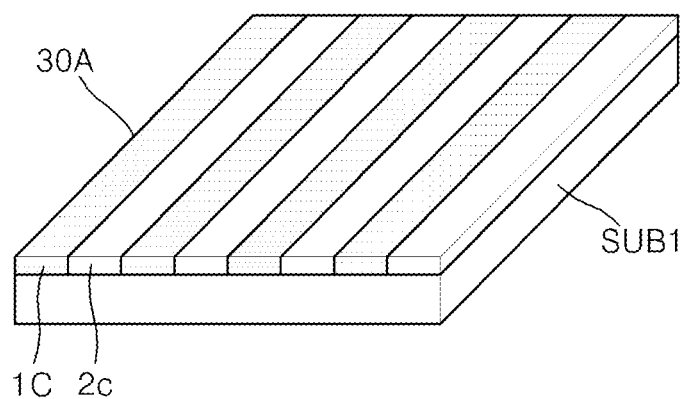
Figure 13E:
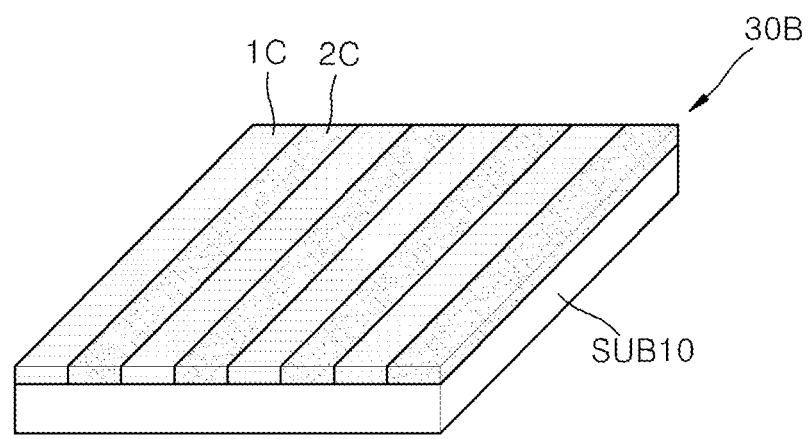

Next, the remaining metal oxide regions 2c are changed into a second metal chalcogenide-based material, thereby forming a second 2D material 2C as shown in FIG. 13E. When an annealing process is performed while supplying a second chalcogen-based material into the reaction chamber (annealing chamber), the metal oxide at the remaining metal oxide regions 2c may react with the second chalcogen-based material, thereby forming the second 2D material 2C. The annealing process may be performed at a temperature in the range of about 300° C. to about 2000° C., for example, but is not limited thereto. The second chalcogen-based material may include one of S, Se, and Te, for example. If the metal oxide is $MoO_3$ and the metal chalcogenide-based material to be formed is $MoTe_2$, the second chalcogen-based material may include tellurium (Te). In other words, when an annealing process is performed with respect to the thin film 30A while supplying Te into the reaction chamber (annealing chamber), the exposed portion of the thin film 30A may be changed to $MoTe_2$. Since the second chalcogen-based material reacts with the metal oxide region 2c easier than the first 2D material 1C, the first 2D material 1C may be unchanged, and only the metal oxide regions 2c may be changed to the second 2D material 2C. The second 2D material 2C may be chemically bonded to the first 2D material 1C. The thin film in which the first 2D material 1C and the second 2D material 2C are formed is referred to as 2D material layer 30B.

The 2D material layer 30B may correspond to the 2D material element 112B of FIG. 9. The first 2D material 1C of the 2D material layer 30B may include one of $MoS_2$, $MoSe_2$, and $MoTe_2$, whereas the second 2D material 2C may include another one of $MoS_2$, $MoSe_2$, and $MoTe_2$. Alternatively, the first 2D material 10 may include one of $WS_2$, $WSe_2$, and $WTe_2$, whereas the second 2D material 2C may include another one of $WS_2$, $WSe_2$, and $WTe_2$. The above-stated materials regarding the first 2D material 1C and the second 2D material 2C are merely examples and are not limited thereto.

In some cases, in the operation shown in FIG. 13D, a second mask layer (not shown) which selectively covers the first 2D material 1C may be formed, and then an operation for changing the metal oxide regions 2c, which is not covered by the second mask layer and is exposed, into the second 2D material 2C may be performed.

Furthermore, although FIGS. 13A through 13E shows a method according to example embodiments in which the 2D material layer 30B including two kinds of 2D materials 1C and 2C is formed, a modification may be made therein to form a 2D material layer including three or more 2D materials. Here, the three or more 2D materials may include $MoS_2$, $MoSe_2$, and $MoTe_2$ or $WS_2$, $WSe_2$, and $WTe_2$, for example. As a result, a 2D material layer as shown in FIG. 10 may be formed.

In addition, FIGS. 13A through 13E shows a case where the starting thin film 30 may be a metal oxide, however, according to example embodiments, the starting thin film 30 may be a metal. In other words, the first and second 2D materials 1C and 2C may be formed from the thin film 30 which is formed of metal. In this case, a first metal region of the thin film 30 may be reacted with a first chalcogen-based material to form the first 2D material 1C, and a second metal region of the thin film 30 may be reacted with a second chalcogen-based material to form the second 2D material 2C. The metal may include one of Mo, W, Nb, V, Ta, Ti, Zr, Hf, Tc, Re, Cu, Ga, In, Sn, Ge, and Pb, for example, and the first and second chalcogen-based materials may include one of S, Se, and Te, for example.

2D material elements according to example embodiments may be applied to various semiconductor devices (electronic devices) for various purposes. For example, 2D material elements according to example embodiments may be applied to various devices, such as a diode, a solar cell, a photodetector, a transistor, a tunneling device, a memory device, a logic device, a light emitting device, an energy storage device, and/or a display device, but example embodiments are not limited thereto. The transistor may have any of various structures including a field effect transistor (FET), a thin film transistor (TFT), a binary junction transistor (BJT), a barrier transistor (that is, a barristor), etc. The 2D material element may be applied to any device employing a PN junction, may replace Si in a Si-based device in the related art, and may be applied to a stackable device, a flexible device, and/or a transparent device. Since a 2D material element according to example embodiments is a 2D material, the 2D material element may be flexible and may be transparent due to a very small thickness. Therefore, such a material may be useful for a stacking device, a flexible device, and/or a transparent device.

A semiconductor device according to example embodiments may include a material layer (semiconductor layer) including any of the 2D material elements described above with reference to FIGS. 1 through 10. For example, the semiconductor device may include a multi-layer structure, and the multi-layer structure may include a semiconductor layer including the 2D material element and at least one non-semiconductor layer disposed on at least one surface of the semiconductor layer. The semiconductor layer may be a 2D material layer. The at least one non-semiconductor layer may include at least one conductive layer and/or at least one insulation layer. The conductive layer may include a conductive 2D material layer, and the insulation layer may include an insulating 2D material layer. For example, the conductive 2D material layer may include graphene, and the insulating 2D material layer may include hexagonal boron nitride (h-BN). However, the non-semiconductor layer may not be a 2D material layer. Any of various insulation materials and conductive materials used in general semiconductor processes may be applied to the non-semiconductor layer. The insulation materials may include silicon oxides, silicon oxynitrides, silicon nitrides, high-k materials having greater dielectric constants than silicon nitrides (e.g., aluminum oxides, hafnium oxides, etc.), insulating organic materials (polymers), etc. The conductive materials may include metals, such as Ti, Al, Cr, Au, Ni, and Pt, metal compounds, and conductive organic materials (polymers). If the non-semiconductor layer is formed of a 2D material, all main components of a semiconductor device may be formed of 2D materials. As a result, it may be easier for miniaturizing and increasing integration degree of the semiconductor device. Furthermore, a flexible device and a transparent device may be embodied.

Hereinafter, various semiconductor devices including 2D material elements according to example embodiments will be described with reference to FIGS. 14 through 22.

Figure 14:
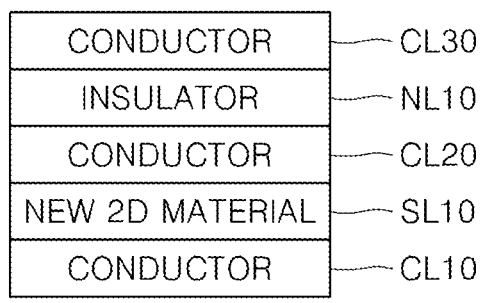
FIGS. 14 through 22 are cross-sectional diagrams showing semiconductor devices including 2D material elements according to example embodiments.

FIG. 14 is a cross-sectional view showing a semiconductor device including a 2D material element, according to example embodiments. FIG. 14 shows an example of tunneling devices.

Referring to FIG. 14, a semiconductor layer SL10 including a 2D material element according to example embodiments may be provided, and a first conductive layer CL10 may be disposed on a first surface (e.g., a lower surface) of the semiconductor layer SL10. A second conductive layer CL20 may be disposed on a second surface (e.g., an upper surface) of the semiconductor layer SL10. An insulation layer NL10 may be disposed on the second conductive layer CL20, and a third conductive layer CL30 may be disposed on the insulation layer NL10. The semiconductor layer SL10 may include any of the 2D material elements according to example embodiments described above with reference to FIGS. 1 through 10. Therefore, the semiconductor layer SL10 may include a plurality of 2D materials that are chemically bonded to one another in a lateral direction. Furthermore, the semiconductor layer SL10 may have a PN structure, a PNP structure, or an NPN structure or may have a plurality of regions having different band gaps. According to example embodiments, the semiconductor layer SL10 may be a tunneling layer. The first conductive layer CL10 may be a drain electrode, the second conductive layer CL20 may be a source electrode, and the third conductive layer CL30 may be a gate electrode. The insulation layer NL10 may be a gate insulation layer. Electric properties of the semiconductor layer SL10 or electric properties of the interface between the second conductive layer CL20 and the semiconductor layer SL10 may be controlled by the third conductive layer CL30. A current may flow between the first conductive layer CL10 and the second conductive layer CL20 due to tunneling of charges via the semiconductor layer SL10.

In FIG. 14, the first through third conductive layers CL10, CL20, and CL30 may be formed of conductive 2D materials or normal conductive materials, which are not 2D materials. Particularly, the second conductive layer CL20 may be formed of a conductive 2D material, such as graphene. Furthermore, the insulation layer NL10 may be either formed of an insulating 2D material, such as h-BN, or a normal insulation material, which is not a 2D material.

Figure 15:
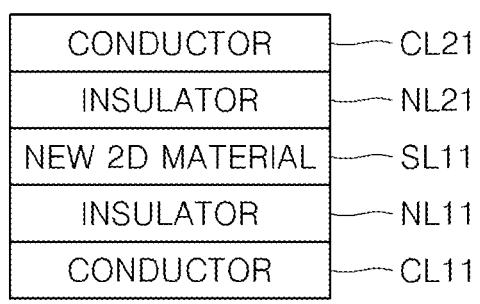

FIG. 15 is a cross-sectional view showing a semiconductor device including a 2D material element, according to example embodiments. FIG. 15 shows an example of BJT devices.

Referring to FIG. 15, a semiconductor layer SL11 including a 2D material element according to example embodiments may be provided, and first and second insulation layer NL11 and NL21 may be disposed at two opposite surfaces of the semiconductor layer SL11. In other words, the semiconductor layer SL11 may be arranged between the first insulation layer NL1 and the second insulation layer NL2. A first conductive layer CL11 facing the semiconductor layer SL11 via the first insulation layer NL11 may be further arranged. A second conductive layer CL21 facing the semiconductor layer SL11 via the second insulation layer NL21 may be further arranged. The semiconductor layer SL11 may include a 2D material element according to example embodiments described above with reference to FIGS. 1 through 10. Therefore, the semiconductor layer SL11 may include a plurality of 2D materials that are chemically bonded to one another in a lateral direction. Furthermore, the semiconductor layer SL11 may have a PN structure, a PNP structure, or an NPN structure or may have a plurality of regions having different band gaps. According to example embodiments, the semiconductor layer SL11 may be a tunneling layer. Furthermore, the semiconductor layer SL11 may be a base. The first conductive layer CL11 may be an emitter, and the second conductive layer CL21 may be a collector. The emitter and collector may be electrode elements. The first insulation layer NL11 may be a first barrier layer, and the second insulation layer NL21 may be a second barrier layer. The first insulation layer NL11 may be a tunneling barrier layer, and the second insulation layer NL21 may be a filtering barrier layer. In example embodiments, semiconductor device may be operated in a manner similar to a general BJT device.

Figure 16:
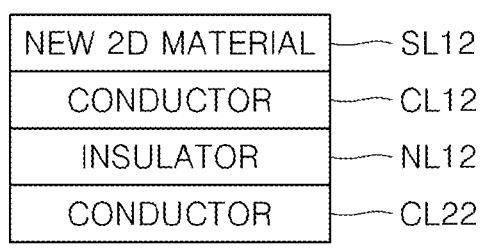

FIG. 16 is a cross-sectional view showing a semiconductor device including a 2D material element, according to example embodiments. FIG. 16 shows an example of barrier transistors (e.g., barristors).

Referring to FIG. 16, a semiconductor layer SL12 including a 2D material element according to example embodiments may be provided, and a first conductive layer CL12 contacting the semiconductor layer SL12 may be provided. A second conductive layer CL22 spaced apart from the first conductive layer CL12 may be provided. An insulation layer NL12 may be disposed between the first conductive layer CL12 and the second conductive layer CL22. The semiconductor layer SL12 may include a 2D material element according to any of the embodiments described above with reference to FIGS. 1 through 10. According to example embodiments, the semiconductor layer SL12 may function as a channel layer. The first conductive layer CL12 may form a Schottky barrier at the interface with the semiconductor layer SL12. The insulation layer NL12 may be a gate insulation layer, and the second conductive layer CL22 may be a gate electrode. Based on a voltage applied to the second conductive layer CL22, the height of the Schottky barrier may be controlled and the semiconductor device may be turned on/off. Although not shown, a source electrode and a drain electrode contacting the semiconductor layer SL12 may be further provided. When the height of the Schottky barrier is low, a current may flow via the source electrode and the drain electrode. When the height of the Schottky barrier is high, flow of the current may be blocked. Here, if the first conductive layer CL12 is formed of graphene, the semiconductor device according to example embodiments may be referred to as a graphene barristor.

Figure 17:
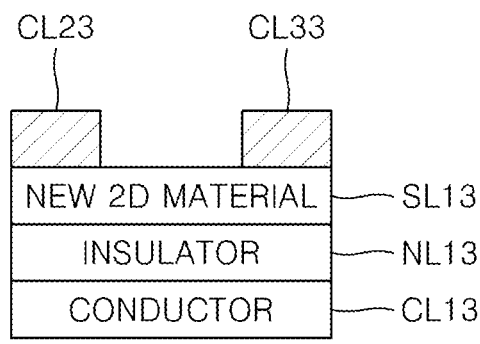

FIG. 17 is a cross-sectional view showing a semiconductor device including a 2D material element, according to example embodiments. FIG. 17 shows an example of field effect transistors (FETs). A photodetector may also have a structure similar to that shown in FIG. 17.

Referring to FIG. 17, a semiconductor layer SL13 including a 2D material element according to example embodiments may be provided, and an insulation layer NL13 may be disposed on a surface (e.g., a lower surface) of the semiconductor layer SL13. A first conductive layer CL13 facing the semiconductor layer SL13 via the insulation layer NL13 may be provided. A second conductive layer CL23 and a third conductive layer CL33, which are apart from each other, may be arranged on another surface (e.g., an upper surface) of the semiconductor layer SL13. The semiconductor layer SL13 may include a 2D material element according to example embodiments described above with reference to FIGS. 1 through 10. According to example embodiments, the semiconductor layer SL13 may be a channel layer. The semiconductor layer SL13 may have a PNP structure or an NPN structure, for example. The insulation layer NL13 may be a gate insulation layer, and the first conductive layer CL13 may be a gate electrode. The second conductive layer CL23 and the third conductive layer CL33 may be a source electrode and a drain electrode, respectively. If the semiconductor layer SL13 has a PNP structure, the second conductive layer CL23 and the third conductive layer CL33 may contact a P-region of the semiconductor layer SL13. If the semiconductor layer SL13 has an NPN structure, the second conductive layer CL23 and the third conductive layer CL33 may contact an N-region of the semiconductor layer SL13. If the structure as shown in FIG. 17 is used as a photodetector, the semiconductor layer SL13 may be a photoactive layer.

Figure 18:
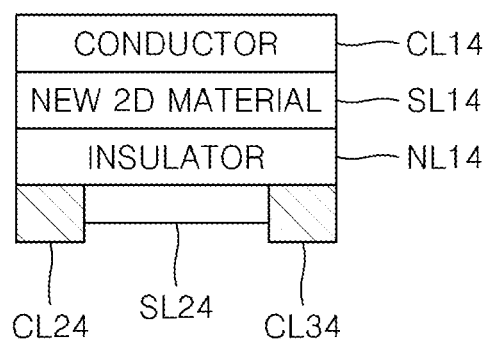

FIG. 18 is a cross-sectional view showing a semiconductor device including a 2D material element, according to example embodiments. FIG. 18 shows an example of memory devices. Here, the memory device may be a charge trapping memory device.

Referring to FIG. 18, a first semiconductor layer SL14 including a 2D material element according to example embodiments may be provided, and an insulation layer NL14 and a first conductive layer CL14 may be disposed on both surfaces of the first semiconductor layer SL14, respectively. For example, the insulation layer NL14 may be disposed on a lower surface of the first semiconductor layer SL14, and the first conductive layer CL14 may be arranged on an upper surface of the first semiconductor layer SL14. A second semiconductor layer SL24 may be disposed on a lower surface of the insulation layer NL14. The second semiconductor layer SL24 may include a 2D semiconductor, or may not include a 2D semiconductor. A second conductive layer CL24 and a third conductive layer CL34 contacting the second semiconductor layer SL24 may be provided. The first semiconductor layer SL14 may include a 2D material element according to any of the embodiments described above with reference to FIGS. 1 through 10. According to example embodiments, the first semiconductor layer SL14 may be a charge trapping layer. The insulation layer NL14 may be a tunnel barrier layer, and the first conductive layer CL14 may be a gate electrode. The second semiconductor layer SL24 may be a channel layer, and the second conductive layer CL24 and the third conductive layer CL34 may be a source electrode and a drain electrode, respectively. Data may be stored in the memory device by using variations in the amount of current flowing between the second conductive layer CL24 and the third conductive layer CL34 according to whether charges trap in the first semiconductor layer SL14.

Figure 19:
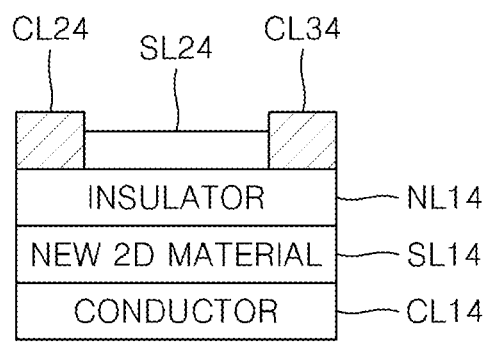

The structures as shown in FIG. 14 through 18 may be turned upside down (that is, reverse structures). For example, when the structure shown in FIG. 18 is turned upside down, the structure as shown in FIG. 19 may be formed.

Figure 20:
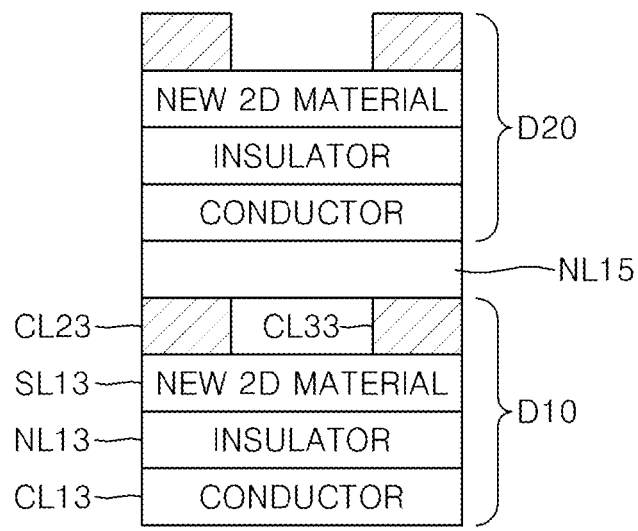

Furthermore, the unit structures as shown in FIG. 14 through 19 may be repeatedly stacked twice or a greater number of times, interposing interlayer insulation layers therebetween. For example, FIG. 20 shows a structure in which the unit structures as shown in FIG. 17 are stacked twice. Referring to FIG. 20, two unit structures (unit devices) D10 and D20 as shown in FIG. 17 are stacked, where an intermediate insulation layer NL15 is interposed therebetween.

In FIGS. 14 through 20, the insulation layers NL10 through NL15 and NL21 may be formed of an insulating 2D material, such as h-BN, or may not include a 2D material. In the case of the latter, the insulation layers NL10 through NL15 and NL21 may include silicon oxides, silicon oxynitrides, silicon nitrides, high-k materials having greater dielectric constants than silicon nitrides (e.g., aluminum oxides, hafnium oxides, etc.), insulating organic materials (polymers), etc. Furthermore, in FIGS. 14 through 20, the conductive layers CL10 through CL34 may be formed of a conductive 2D material, such as graphene, or may not include a 2D material. In the case of the latter, the conductive layers CL10 through CL34 may include metals, such as Ti, Al, Cr, Au, Ni, and Pt, metal compounds, and conductive organic materials (polymers). If the insulation layers NL10 through NL15 and NL21 and the conductive layers CL10 through CL34 are formed of 2D materials, all main components of a semiconductor device may be formed of 2D materials. As a result, it may be easier for miniaturizing and increasing integration of the semiconductor device. If main components of a semiconductor device is formed of 2D materials, the overall thickness of the unit device (e.g., D10 or D20 of FIG. 20) may be very small (smaller than or equal to 10 nm), and thus effects such as increased capacity due to increased integration degree may be acquired. Furthermore, if main components of a semiconductor device are formed of 2D materials, a flexible device and/or a transparent device may be easily embodied.

An insulation material for a flexible device may include an insulating 2D material such as h-BN, or an organic-inorganic hybrid material, or a general insulating oxide such as $Al_2O_3$, $HfO_2$, $TiO_2$, and so on. The organic-inorganic hybrid material may be an organic-inorganic hybrid siloxane, and the organic-inorganic hybrid siloxane may include SiOC, for example. The insulation material for a flexible device may have a thickness equal to or less than about 10 nm. The insulation material for a flexible device may be a very thin material (e.g., 2D material) which may have no interlayer interaction. In a case where the insulation material is a hybrid material (e.g., SiOC) having a relatively good toughness, the insulation material may have a thickness greater than about 10 nm.

Figure 21:
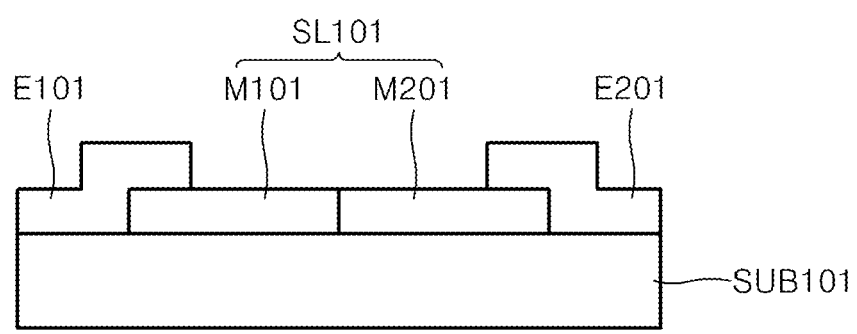

FIG. 21 is a cross-sectional view showing a semiconductor device including a 2D material element, according to example embodiments. FIG. 21 shows an example of diodes.

Referring to FIG. 21, a semiconductor layer SL101 may be disposed on a substrate SUB101. The semiconductor layer SL101 may include a 2D material element according to example embodiments. For example, the semiconductor layer SL101 may include a first 2D material M101 and a second 2D material M201. The second 2D material M201 may be chemically bonded to a side of the first 2D material M101. The first 2D material M101 and the second 2D material M201 may correspond to the first 2D material M10 and the second 2D material M20 of FIG. 1, respectively. The first 2D material M101 and the second 2D material M201 may also correspond to the first 2D material M11 and the second 2D material M21 of FIG. 2. In this case, the first 2D material M101 and the second 2D material M201 may be an n-type semiconductor and a p-type semiconductor, respectively. Therefore, the semiconductor layer SL101 may have a PN junction structure. A first electrode E101 contacting the first 2D material M101 may be provided, and a second electrode E201 contacting the second 2D material M201 may be provided. Shapes of the first electrode E101 and the second electrode E201 may vary.

Figure 22:
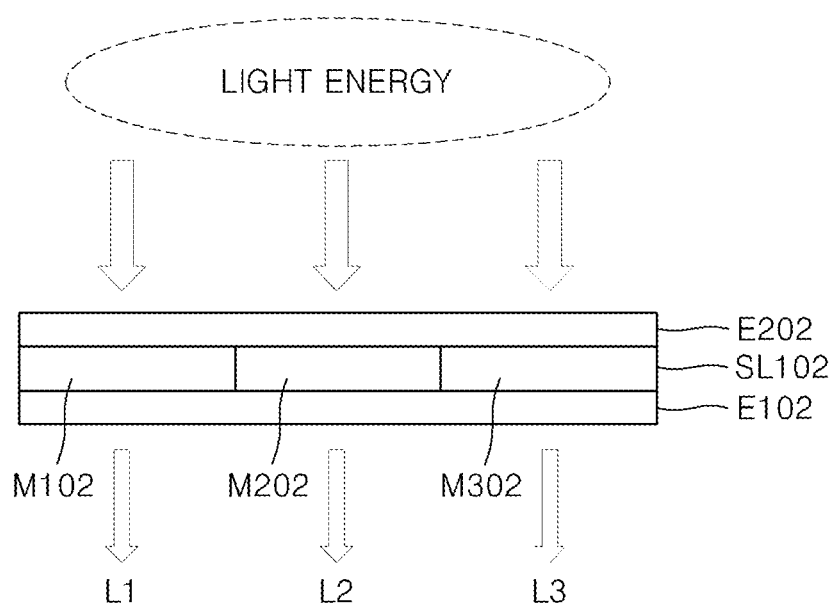

FIG. 22 is a cross-sectional view showing a semiconductor device including a 2D material element, according to example embodiments. FIG. 22 shows an example of solar cells.

Referring to FIG. 22, a semiconductor layer SL102 including a 2D material element according to example embodiments may be provided. The semiconductor layer SL102 may include a plurality of regions M102, M202, and M302 having different band gaps. For example, the semiconductor layer SL102 may include a plurality of 2D materials M102, M202, and M302. For example, the first through third 2D materials M102, M202, and M302 may correspond to the first through third 2D materials M14, M24, and M34 of FIG. 6, respectively. A first electrode E102 may be arranged on a first surface (e.g., a lower surface) of the semiconductor layer SL102, and a second electrode E201 may be arranged on a second surface (e.g., an upper surface) of the semiconductor layer SL102. The first and second electrodes E102 and E201 may be transparent electrodes. Light energy may be incident to the semiconductor layer SL102 from above the second electrode E201. Since the first through third 2D materials M102, M202, and M302 have different band gaps, light energy in a large region (wide band) may be absorbed by the first through third 2D materials M102, M202, and M302. In other words, the first 2D material M102 may absorb light of a first wavelength region, the second 2D material M202 may absorb light of a second wavelength region, and the third 2D material M302 may absorb light of a third wavelength region. Therefore, wavelength region of light absorbed by the semiconductor layer SL102 may be widened, thereby improving energy conversion efficiency. Meanwhile, the reference numerals L1, L2, and L3 denote lights transmitted without being absorbed by the first through third 2D materials M102, M202, and M302 (transmitted lights).

It should be understood that example embodiments described herein should be considered in a descriptive sense only and not for purposes of limitation. Descriptions of features or aspects within each two-dimensional (2D) material element, semiconductor device and/or method of manufacturing the same according to example embodiments should typically be considered as available for other similar features or aspects in other two-dimensional (2D) material element, semiconductor device and/or method of manufacturing the same according to example embodiments. For example, one of ordinary skill in the art will understand that compositions and structures of the 2D material elements of FIGS. 1 through 10 and FIGS. 23 and 24 may vary. For example, the 2D materials M10 and M20 may be materials other than metal chalcogenide-based materials, and the 2D materials M10 and M20 may exhibit conductor or insulator properties instead of semiconductor properties. Furthermore, one of ordinary skill in the art will understand that the methods of fabricating a 2D material element described above with reference to FIGS. 11A through 11C, 12A and 12B, and 13A through 13E may vary. Furthermore, structures of devices including 2D materials according to example embodiments are not limited to those shown in FIGS. 14 through 22 and may vary.

While some example embodiments have been described with reference to the figures, it will be understood by those of ordinary skill in the art that various changes in form and details may be made therein without departing from the spirit and scope of the claims.

What is claimed is:

1. A two-dimensional (2D) material element comprising:
   a first 2D material including a first monolayer of crystalline material that includes a first metal chalcogenide-based material; and
   a second 2D material including a second monolayer of crystalline material that includes a second metal chalcogenide-based material,
   a side corresponding to a thickness of the second 2D material being chemically bonded to a side corresponding to a thickness of the first 2D material,
   the first and second monolayers of crystalline material being arranged laterally and in plane with each other,
   the first metal chalcogenide-based material includes a first metal atom,
   the second metal chalcogenide-based material includes a second metal atom, and
   the first and second metal atoms being different from each other.

2. The 2D material element of claim 1, wherein the first 2D material and the second 2D material are covalently bonded to each other.

3. The 2D material element of claim 1, wherein
   the first 2D material and the second 2D material are interatomically bonded to each other, and
   the first 2D material and the second 2D material have a continuous crystal structure at a bonding portion between the first 2D material and the second 2D material.

4. The 2D material element of claim 1, wherein
   the first metal chalcogenide-based material is a first transition metal dichalcogenide (TMDC) material,
   the second metal chalcogenide-based material is a second transition metal dichalcogenide (TMDC) material, and
   the first and second metal dichalcogenide (TMDC) materials are different from each other.

5. The 2D material element of claim 1, wherein at least one of the first metal chalcogenide-based material and the second metal chalcogenide-based material include:
   a metal atom including one of Mo, W, Nb, V, Ta, Ti, Zr, Hf, Tc, Re, Cu, Ga, In, Sn, Ge, and Pb, and
   a chalcogen atom including one of S, Se, and Te.

6. The 2D material element of claim 1, wherein the first 2D material and the second 2D material are semiconductors.

7. The 2D material element of claim 1, wherein
   the first 2D material is an n-type semiconductor, and
   the second 2D material is a p-type semiconductor.

8. The 2D material element of claim 7, wherein
   the first metal chalcogenide-based material includes a first chalcogen atom,
   the second metal chalcogenide-based material includes a second chalcogen atom, and
   the first and second chalcogen atoms are the same.

9. The 2D material element of claim 7, wherein the first metal chalcogenide-based material is one of $MoS_2$, $MoSe_2$, $MoTe_2$, $WSe_2$, and $WTe_2$.

10. The 2D material element of claim 7, wherein the second metal chalcogenide-based material is one of $WS_2$, $ZrS_2$, $ZrSe_2$, $HfS_2$, $HfSe_2$, and $NbSe_2$.

11. The 2D material element of claim 7, wherein
    the first metal chalcogenide-based material includes $MoS_2$, and
    the second metal chalcogenide-based material includes $WS_2$.

12. The 2D material element of claim 1, wherein one of the first and second 2D materials is arranged at two opposite sides of the other one of the first and second 2D materials.

13. The 2D material element of claim 1, wherein
the first 2D material is one of a plurality of first 2D materials,
the second 2D material is one of a plurality of second 2D materials, and
the plurality of first and second 2D materials define a patterned structure.

14. The 2D material element of claim 1, further comprising:
a third 2D material bonded to a side of one of the first 2D material and the second 2D material.

15. A semiconductor device comprising:
a multi-layer structure including a semiconductor layer and at least one non-semiconductor layer, wherein
the semiconductor layer includes the 2D material element of claim 1, and
the at least one non-semiconductor layer is on or under at least one surface of the semiconductor layer.

16. The semiconductor device of claim 15, wherein
the multi-layer structure includes a first conductive layer and a second conductive layer,
the semiconductor layer is on the first conductive layer, and
the second conductive layer is on the semiconductor layer.

17. The semiconductor device of claim 16, wherein
the multi-layer structure further includes a third conductive layer and an insulation layer,
the third conductive layer is on the second conductive layer, and
the insulation layer is between the second conductive layer and the third conductive layer.

18. The semiconductor device of claim 15, wherein
the multi-layer structure includes a first insulation layer, a second insulation layer, a first conductive layer, and a second conductive layer,
the semiconductor layer is on the first insulation layer,
the second insulation layer is on the semiconductor layer,
the first insulation layer is on the first conductive layer,
the first conductive layer faces the semiconductor layer,
the second conductive layer is on the second insulation layer, and
the second conductive layer faces the semiconductor layer.

19. The semiconductor device of claim 15, wherein
the multi-layer structure includes a first conductive layer, a second conductive layer, and an insulation layer,
the second conductive layer is on the first conductive layer,
and the insulation layer is between the first conductive layer and the second conductive layer.

20. The semiconductor device of claim 15, wherein the multi-layer structure comprises:
a first conductive layer spaced apart from the semiconductor layer;
an insulation layer between the semiconductor layer and the first conductive layer; and
a second conductive layer and a third conductive layer that contact first and second regions of the semiconductor layer, respectively.

21. The semiconductor device of claim 15, wherein
the multi-layer structure includes an insulation layer and a first conductive layer,
the semiconductor layer is on the insulation layer, and
the first conductive layer is on the semiconductor layer.

22. The semiconductor device of claim 21, wherein the multi-layer structure includes:
a second semiconductor layer facing the semiconductor layer, the insulation layer being between the semiconductor layer and the second semiconductor layer; and
a second conductive layer and a third conductive layer that contact first and second regions of the second semiconductor layer, respectively.

23. The semiconductor device of claim 15, wherein the at least one non-semiconductor layer includes at least one of a conductive 2D material and an insulating 2D material.

24. The semiconductor device of claim 15, wherein the semiconductor layer includes at least one of a PN junction structure, a PNP junction structure, and an NPN junction structure.

25. The semiconductor device of claim 15, wherein the semiconductor layer includes a plurality of 2D materials having different energy band gaps.

26. The semiconductor device of claim 15, wherein
the semiconductor device is a tunneling device, and
the semiconductor layer is a tunneling layer.

27. The semiconductor device of claim 15, wherein
the semiconductor device is a binary junction transistor (BJT), and
the semiconductor layer is a tunneling layer.

28. The semiconductor device of claim 15, wherein
the semiconductor device is a barristor, and
the semiconductor layer is a channel layer.

29. The semiconductor device of claim 15, wherein
the semiconductor device is a field effect transistor (FET), and
the semiconductor layer is a channel layer.

30. The semiconductor device of claim 15, wherein
the semiconductor device is a memory device, and
the semiconductor layer is a charge trapping layer.

31. The semiconductor device of claim 15, wherein the semiconductor device is a diode.

32. The semiconductor device of claim 15, wherein the semiconductor device is a solar cell.

33. The semiconductor device of claim 15, wherein the semiconductor device is a photodetector.

34. A two-dimensional (2D) material element comprising:
a first 2D material including a first monolayer of crystalline material that includes a first metal chalcogenide-based material; and
a second 2D material including a second monolayer of crystalline material that includes a second metal chalcogenide-based material,
a side corresponding to a thickness of the second 2D material being chemically bonded to a side corresponding to a thickness of the first 2D material,
the first and second monolayers of crystalline material being arranged laterally and in plane with each other,
wherein a band gap of the first 2D material is different than a band gap of the second 2D material.

35. The 2D material element of claim 34, wherein
the first metal chalcogenide-based material includes a first chalcogen atom,
the second metal chalcogenide-based material includes a second chalcogen atom, and
the first and second chalcogen atoms are different from each other.

36. The 2D material element of claim 34, wherein
the first metal chalcogenide-based material includes a first metal atom,
the second metal chalcogenide-based material includes a second metal atom, and the first and second metal atoms are the same.

37. The 2D material element of claim 34, wherein
the first metal chalcogenide-based material is one of $MoS_2$, $MoSe_2$, and $MoTe_2$, and
the second metal chalcogenide-based material is another one of $MoS_2$, $MoSe_2$, and $MoTe_2$.

38. The 2D material element of claim 34, wherein
the first metal chalcogenide-based material is one of $WS_2$, $WSe_2$, and $WTe_2$, and
the second metal chalcogenide-based material is another one of $WS_2$, $WSe_2$, and $WTe_2$.

39. A semiconductor device comprising:
a semiconductor layer including the 2D material element of claim 34.

40. A two-dimensional (2D) material element comprising:
a first 2D material chemically bonded to a second 2D material,
the first 2D material including a first crystalline material monolayer of a first metal chalcogenide,
the second 2D material including a second crystalline material monolayer of a second metal chalcogenide,
the first and second metal chalcogenides having one of different metal atoms and different chalcogen atoms,
the first crystalline material monolayer is arranged laterally and in plane with the second crystalline monolayer,
a side corresponding to a thickness of the first crystalline monolayer being chemically bonded to a side corresponding to a thickness of the second crystalline monolayer.

41. The 2D material element of claim 40, wherein
the first metal chalcogenide includes a first metal,
the second metal chalcogenide includes a second metal, and
at least one of the first and second metals is a transition metal.

42. The 2D material element of claim 40, wherein the first metal chalcogenide and the second metal chalcogenide each independently include:
a metal atom including one of Mo, W, Nb, V, Ta, Ti, Zr, Hf, Tc, Re, Cu, Ga, In, Sn, Ge, and Pb; and
a chalcogen atom including one of S, Se, and Te.

43. The 2D material element of claim 40, further comprising:
a third 2D material including a third monolayer of crystalline material including a third metal chalcogenide, wherein
the side corresponding to the thickness of the first crystalline monolayer and a side corresponding to a thickness of the third crystalline monolayer are chemically bonded to opposite sides corresponding to a thickness of the second crystalline monolayer, respectively.

44. A semiconductor device comprising:
a semiconductor layer including the 2D material element of claim 40.

* * * * *